(12) United States Patent
Zhang et al.

(10) Patent No.: US 11,508,750 B2
(45) Date of Patent: Nov. 22, 2022

(54) THREE-DIMENSIONAL MEMORY DEVICE INCLUDING A PERIPHERAL CIRCUIT AND A MEMORY STACK

(71) Applicant: YANGTZE MEMORY TECHNOLOGIES CO., LTD., Wuhan (CN)

(72) Inventors: Kun Zhang, Wuhan (CN); Di Wang, Wuhan (CN); Lei Liu, Wuhan (CN); Wenxi Zhou, Wuhan (CN); Zhiliang Xia, Wuhan (CN)

(73) Assignee: YANGTZE MEMORY TECHNOLOGIES CO., LTD., Wuhan (CN)

(*) Notice: Subject to any disclaimer, the term of this patent is extended or adjusted under 35 U.S.C. 154(b) by 0 days.

(21) Appl. No.: 16/920,201

(22) Filed: Jul. 2, 2020

(65) Prior Publication Data
US 2021/0320119 A1 Oct. 14, 2021

Related U.S. Application Data

(63) Continuation of application No. PCT/CN2020/092511, filed on May 27, 2020.

(30) Foreign Application Priority Data

Apr. 14, 2020 (WO) ............... PCT/CN2020/084600
Apr. 14, 2020 (WO) ............... PCT/CN2020/084603

(Continued)

(51) Int. Cl.
*H01L 27/11582* (2017.01)
*H01L 23/00* (2006.01)
(Continued)

(52) U.S. Cl.
CPC ........ *H01L 27/11582* (2013.01); *H01L 24/29* (2013.01); *H01L 27/1157* (2013.01);
(Continued)

(58) Field of Classification Search
CPC ......... H01L 27/11582; H01L 27/11573; H01L 27/1157; H01L 27/11551; H01L 27/11552;
(Continued)

(56) References Cited

U.S. PATENT DOCUMENTS 9,245,962 B1 1/2016 Yang et al.
9,666,594 B2* 5/2017 Mizuno ............... H01L 29/7923
(Continued)

FOREIGN PATENT DOCUMENTS

CN 109817633 A 5/2019
CN 110970441 A 4/2020
TW I670711 B 9/2019

*Primary Examiner* — Khiem D Nguyen
(74) *Attorney, Agent, or Firm* — Bayes PLLC

(57) ABSTRACT

Embodiments of 3D memory devices and methods for forming the same are disclosed. In an example, a 3D memory device includes a substrate, a peripheral circuit on the substrate, a memory stack including interleaved conductive layers and dielectric layers above the peripheral circuit, a first semiconductor layer above the memory stack, a second semiconductor layer above and in contact with the first semiconductor layer, a plurality of channel structures each extending vertically through the memory stack and the first semiconductor layer, and an insulating structure extending vertically through the memory stack, the first semiconductor layer, and the second semiconductor layer.

20 Claims, 13 Drawing Sheets

(30) Foreign Application Priority Data

Apr. 27, 2020 (WO) ................ PCT/CN2020/087295
Apr. 27, 2020 (WO) ................ PCT/CN2020/087296

(51) Int. Cl.
*H01L 27/11565* (2017.01)
*H01L 27/1157* (2017.01)
*H01L 27/11573* (2017.01)

(52) U.S. Cl.
CPC .. *H01L 27/11565* (2013.01); *H01L 27/11573* (2013.01); *H01L 2924/1438* (2013.01)

(58) Field of Classification Search
CPC ......... H01L 27/11553; H01L 27/11554; H01L 27/11555; H01L 27/11556; H01L 24/29; H01L 2924/1438
USPC ....................................................... 257/314
See application file for complete search history.

(56) References Cited

U.S. PATENT DOCUMENTS

| | | | |
|---|---|---|---|
| 9,673,213 B1 | 6/2017 | Yu et al. | |
| 10,510,415 B1* | 12/2019 | Huo | H01L 27/11582 |
| 10,553,599 B1 | 2/2020 | Chen et al. | |
| 10,734,080 B2* | 8/2020 | Chibvongodze | H01L 27/11519 |
| 10,811,071 B1* | 10/2020 | Li | H01L 27/1157 |
| 2017/0069636 A1* | 3/2017 | Park | H01L 27/11582 |
| 2017/0317099 A1* | 11/2017 | Huang | H01L 23/5226 |
| 2019/0221557 A1 | 7/2019 | Kim et al. | |
| 2019/0244892 A1* | 8/2019 | Zhu | H01L 27/11565 |
| 2020/0058669 A1* | 2/2020 | Chen | H01L 27/11582 |
| 2020/0091188 A1* | 3/2020 | Lee | H01L 27/249 |
| 2020/0279862 A1* | 9/2020 | Rajashekhar | H01L 27/11573 |
| 2021/0159149 A1* | 5/2021 | Kitazawa | H01L 23/481 |

* cited by examiner

100

THREE-DIMENSIONAL MEMORY DEVICE INCLUDING A PERIPHERAL CIRCUIT AND A MEMORY STACK

CROSS-REFERENCE TO RELATED APPLICATIONS

This application is continuation of International Application No. PCT/CN2020/092511, filed on May 27, 2020, entitled "THREE-DIMENSIONAL MEMORY DEVICE AND METHOD FOR FORMING THE SAME," which is hereby incorporated by reference in its entirety. This application also claims the benefit of priorities to International Application No. PCT/CN2020/084600, filed on Apr. 14, 2020, entitled "THREE-DIMENSIONAL MEMORY DEVICE WITH BACKSIDE SOURCE CONTACT," International Application No. PCT/CN2020/084603, filed on Apr. 14, 2020, entitled "METHOD FOR FORMING THREE-DIMENSIONAL MEMORY DEVICE WITH BACKSIDE SOURCE CONTACT," International Application No. PCT/CN2020/087295, filed on Apr. 27, 2020, entitled "THREE-DIMENSIONAL MEMORY DEVICE AND METHOD FOR FORMING THE SAME," and International Application No. PCT/CN2020/087296, filed on Apr. 27, 2020, entitled "THREE-DIMENSIONAL MEMORY DEVICE AND METHOD FOR FORMING THE SAME," all of which are incorporated herein by reference in their entireties.

BACKGROUND

Embodiments of the present disclosure relate to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

SUMMARY

Embodiments of 3D memory devices and methods for forming the same are disclosed herein.

In one example, a 3D memory device includes a substrate, a peripheral circuit on the substrate, a memory stack including interleaved conductive layers and dielectric layers above the peripheral circuit, a first semiconductor layer above the memory stack, a second semiconductor layer above and in contact with the first semiconductor layer, a plurality of channel structures each extending vertically through the memory stack and the first semiconductor layer, and an insulating structure extending vertically through the memory stack, the first semiconductor layer, and the second semiconductor layer.

In another example, a 3D memory device includes a first semiconductor structure, a second semiconductor structure, and a bonding interface between the first semiconductor structure and the second semiconductor structure. The first semiconductor structure includes a peripheral circuit. The second semiconductor structure includes a memory stack including interleaved conductive layers and dielectric layers, a doped semiconductor layer, a plurality of channel structures each extending vertically through the memory stack into the doped semiconductor layer and electrically connected to the peripheral circuit, and an insulating structure extending vertically through the memory stack and the doped semiconductor layer and extending laterally to separate the plurality of channel structures into a plurality of blocks.

In still another example, a method for forming a 3D memory device is disclosed. A trench is formed in a doped region on a first side of a substrate. A sacrificial layer above the doped region and in the trench, and a dielectric stack on the sacrificial layer are subsequently formed. A channel structure extending vertically through the dielectric stack and the sacrificial layer into the doped region is formed. An opening extending vertically through the dielectric stack is formed to be connected to the trench. The sacrificial layer is replaced, through the opening, with a doped semiconductor layer between the doped region and the dielectric stack. An insulating structure is formed in the opening and the trench. The substrate is thinned from a second side opposite to the first side of the substrate until reaching an end of the insulating structure to expose the doped region.

In yet another example, a method for forming a 3D memory device is disclosed. A peripheral circuit is formed on a first substrate. A channel structure and an insulating structure each extending vertically through a memory stack and a doped semiconductor layer into a doped region on a first side of a second substrate are formed. The first substrate and the second substrate are bonded in a face-to-face manner, such that the memory stack is above the peripheral circuit. The second substrate is thinned from a second side opposite to the first side of the second substrate until reaching an end of the insulating structure to expose the doped region of the second substrate.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
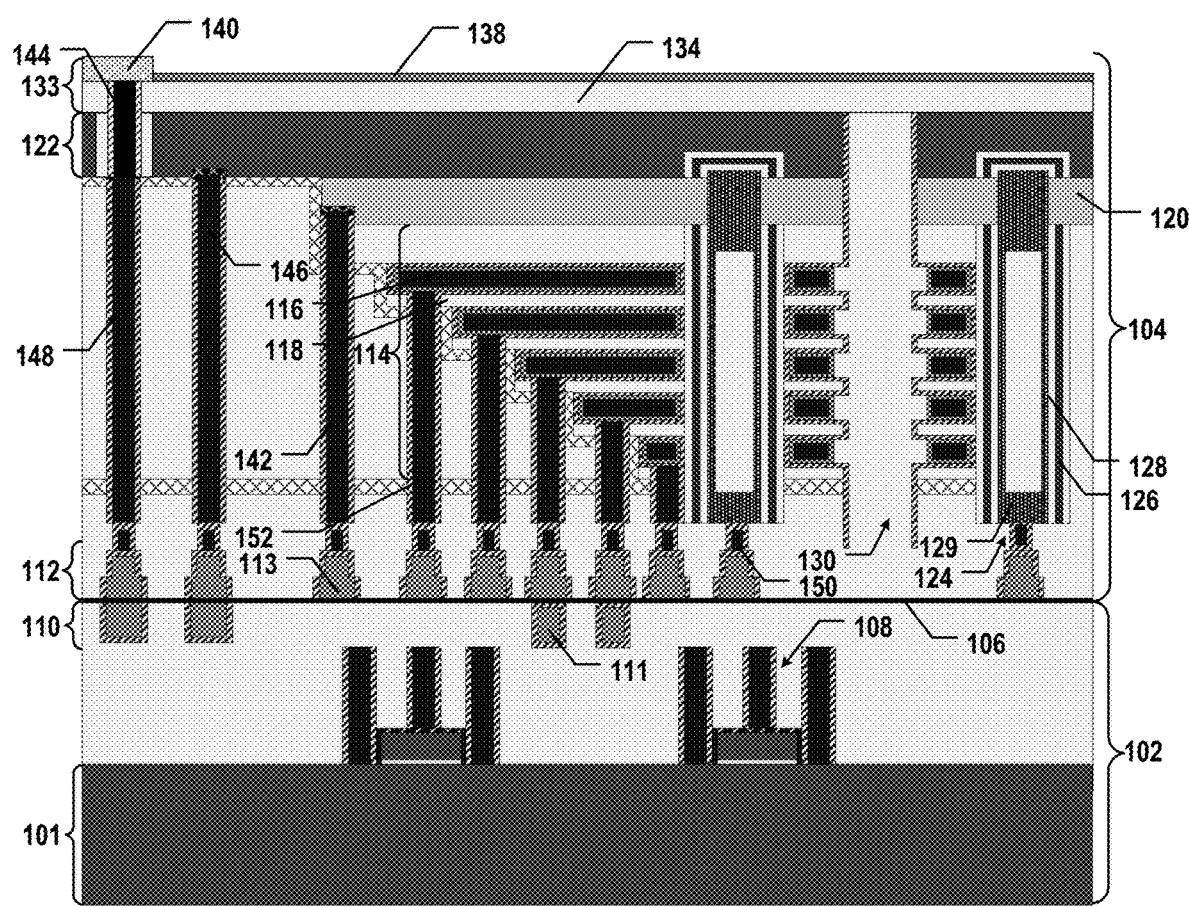
FIG. 1 illustrates a side view of a cross-section of an exemplary 3D memory device, according to some embodiments of the present disclosure.
Figure 1:
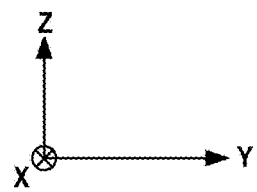

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or vertical interconnect access (via) contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

In some 3D memory devices, such as 3D NAND memory devices, slit openings (e.g., gate line slits (GLSs)) are used as the pathways for transporting etchants and reaction gases during the gate replacement process when forming the memory stack. However, as the level of memory stack keeps increasing, the etching of slit openings with high aspect ratio becomes more challenging. In particular, when a slit opening extends laterally over both the staircase region and the core array region of the memory stack, which have different film structures, the gouging variation of the slit opening in different regions becomes difficult to control. For example, the etching depth of the slit opening may be greater in the staircase region than in the core array region, thereby causing damage to the substrate in the staircase region. The gouging variation issue can be exaggerated for 3D NAND memory devices with semiconductor plugs selectively grown at the sidewall of the channel structures (also known as "sidewall selective epitaxial growth (SEGs)"), which has strict requirements for gouging variation.

Various embodiments in accordance with the present disclosure provide 3D memory devices and fabrication methods thereof that can compensate for gouging variation. A trench laterally aligned with the slit opening and filled with sacrificial material(s) (e.g., polysilicon) can be used as the etch stop layer in forming the slit opening as well as a buffer to balance the etch loading between the core array region and staircase region, thereby compensating for the gouging variation among different regions. In some embodiments, the trench and slit opening are filled with dielectric materials to form an insulating structure. The end of the insulating structure can be used as the stop layer to automatically stop the backside thinning process (e.g., chemical mechanical polishing (CMP)) applied to the substrate, thereby achieving a uniform thickness of the thinned substrate. As a result, the fabrication complexity can be reduced, and the production yield can be increased.

FIG. 1 illustrates a side view of a cross-section of an exemplary 3D memory device 100, according to some embodiments of the present disclosure. In some embodiments, 3D memory device 100 is a bonded chip including a first semiconductor structure 102 and a second semiconductor structure 104 stacked over first semiconductor structure 102. First and second semiconductor structures 102 and 104 are jointed at a bonding interface 106 therebetween, according to some embodiments. As shown in FIG. 1, first semiconductor structure 102 can include a substrate 101, which can include silicon (e.g., single crystalline silicon), silicon germanium (SiGe), gallium arsenide (GaAs), germanium (Ge), silicon on insulator (SOI), or any other suitable materials.

First semiconductor structure 102 of 3D memory device 100 can include peripheral circuits 108 on substrate 101. It is noted that x-, y-, and z-axes are included in FIG. 1 to illustrate the spatial relationships of the components in 3D memory device 100. Substrate 101 includes two lateral surfaces extending laterally in the x-y plane: a front surface on the front side of the wafer, and a back surface on the backside opposite to the front side of the wafer. In some embodiments, the x- and y-directions are two orthogonal directions in the wafer plane: x-direction is the word line direction, and the y-direction is the bit line direction. The z-axis is perpendicular to both the x- and y-axes. As used herein, whether one component (e.g., a layer or a device) is "on," "above," or "below" another component (e.g., a layer or a device) of a semiconductor device (e.g., 3D memory device 100) is determined relative to the substrate of the semiconductor device (e.g., substrate 101) in the z-direction (the vertical direction perpendicular to the x-y plane) when the substrate is positioned in the lowest plane of the semiconductor device in the z-direction. The same notion for describing spatial relationships is applied throughout the present disclosure.

In some embodiments, peripheral circuit 108 is configured to control and sense the 3D memory device 100. Peripheral circuit 108 can be any suitable digital, analog, and/or mixed-signal control and sensing circuits used for facilitating the operation of 3D memory device 100 including, but not limited to, a page buffer, a decoder (e.g., a row decoder and a column decoder), a sense amplifier, a driver (e.g., a word line driver), a charge pump, a current or voltage reference, or any active or passive components of the circuit (e.g., transistors, diodes, resistors, or capacitors). Peripheral circuits 108 can include transistors formed "on" substrate 101, in which the entirety or part of the transistors are formed in substrate 101 (e.g., below the top surface of substrate 101) and/or directly on substrate 101. Isolation regions (e.g., shallow trench isolations (STIs)) and doped regions (e.g., source regions and drain regions of the transistors) can be formed in substrate 101 as well. The transistors are high-speed with advanced logic processes (e.g., technology nodes of 90 nm, 65 nm, 45 nm, 32 nm, 28 nm, 20 nm, 16 nm, 14 nm, 10 nm, 7 nm, 5 nm, 3 nm, 2 nm, etc.), according to some embodiments. It is understood that in some embodiments, peripheral circuit 108 may further include any other circuits compatible with the advanced logic processes including logic circuits, such as processors and programmable logic devices (PLDs), or memory circuits, such as static random-access memory (SRAM) and dynamic random-access memory (DRAM).

In some embodiments, first semiconductor structure 102 of 3D memory device 100 further includes an interconnect layer (not shown) above peripheral circuits 108 to transfer electrical signals to and from peripheral circuits 108. The interconnect layer can include a plurality of interconnects (also referred to herein as "contacts"), including lateral interconnect lines and vertical interconnect access (VIA) contacts. As used herein, the term "interconnects" can broadly include any suitable types of interconnects, such as middle-end-of-line (MEOL) interconnects and back-end-of-line (BEOL) interconnects. The interconnect layer can further include one or more interlayer dielectric (ILD) layers (also known as "intermetal dielectric (IMD) layers") in which the interconnect lines and VIA contacts can form. That is, the interconnect layer can include interconnect lines and VIA contacts in multiple ILD layers. The interconnect lines and VIA contacts in the interconnect layer can include conductive materials including, but not limited to, tungsten (W), cobalt (Co), copper (Cu), aluminum (Al), silicides, or any combination thereof. The ILD layers in the interconnect layer can include dielectric materials including, but not limited to, silicon oxide, silicon nitride, silicon oxynitride, low dielectric constant (low-k) dielectrics, or any combination thereof.

As shown in FIG. 1, first semiconductor structure 102 of 3D memory device 100 can further include a bonding layer 110 at bonding interface 106 and above the interconnect layer and peripheral circuits 108. Bonding layer 110 can include a plurality of bonding contacts 111 and dielectrics electrically isolating bonding contacts 111. Bonding contacts 111 can include conductive materials including, but not limited to, W, Co, Cu, Al, silicides, or any combination thereof. The remaining area of bonding layer 110 can be formed with dielectrics including, but not limited to, silicon oxide, silicon nitride, silicon oxynitride, low-k dielectrics, or any combination thereof. Bonding contacts 111 and surrounding dielectrics in bonding layer 110 can be used for hybrid bonding.

Similarly, as shown in FIG. 1, second semiconductor structure 104 of 3D memory device 100 can also include a bonding layer 112 at bonding interface 106 and above bonding layer 110 of first semiconductor structure 102. Bonding layer 112 can include a plurality of bonding contacts 113 and dielectrics electrically isolating bonding contacts 113. Bonding contacts 113 can include conductive materials including, but not limited to, W, Co, Cu, Al, silicides, or any combination thereof. The remaining area of bonding layer 112 can be formed with dielectrics including, but not limited to, silicon oxide, silicon nitride, silicon oxynitride, low-k dielectrics, or any combination thereof. Bonding contacts 113 and surrounding dielectrics in bonding layer 112 can be used for hybrid bonding. Bonding contacts 113 are in contact with bonding contacts 111 at bonding interface 106, according to some embodiments.

As described below in detail, second semiconductor structure 104 can be bonded on top of first semiconductor structure 102 in a face-to-face manner at bonding interface 106. In some embodiments, bonding interface 106 is disposed between bonding layers 110 and 112 as a result of hybrid bonding (also known as "metal/dielectric hybrid bonding"), which is a direct bonding technology (e.g., forming bonding between surfaces without using intermediate layers, such as solder or adhesives) and can obtain metal-metal bonding and dielectric-dielectric bonding simultaneously. In some embodiments, bonding interface 106 is the place at which bonding layers 112 and 110 are met and bonded. In practice, bonding interface 106 can be a layer with a certain thickness that includes the top surface of bonding layer 110 of first semiconductor structure 102 and the bottom surface of bonding layer 112 of second semiconductor structure 104.

In some embodiments, second semiconductor structure 104 of 3D memory device 100 further includes an interconnect layer (not shown) above bonding layer 112 to transfer electrical signals. The interconnect layer can include a plurality of interconnects, such as MEOL interconnects and BEOL interconnects. The interconnect layer can further include one or more ILD layers in which the interconnect lines and VIA contacts can form. The interconnect lines and VIA contacts in the interconnect layer can include conductive materials including, but not limited to, W, Co, Cu, Al, silicides, or any combination thereof. The ILD layers in the interconnect layer can include dielectric materials including, but not limited to, silicon oxide, silicon nitride, silicon oxynitride, low-k dielectrics, or any combination thereof.

In some embodiments, 3D memory device 100 is a NAND Flash memory device in which memory cells are provided in the form of an array of NAND memory strings. As shown in FIG. 1, second semiconductor structure 104 of 3D memory device 100 can include an array of channel structures 124 functioning as the array of NAND memory strings. As shown in FIG. 1, each channel structure 124 can extend vertically through a plurality of pairs each including a conductive layer 116 and a dielectric layer 118. The interleaved conductive layers 116 and dielectric layers 118 are part of a memory stack 114. The number of the pairs of conductive layers 116 and dielectric layers 118 in memory stack 114 (e.g., 32, 64, 96, 128, 160, 192, 224, 256 levels, or more) determines the number of memory cells in 3D memory device 100. It is understood that in some embodiments, memory stack 114 may have a multi-deck architecture (not shown), which includes a plurality of memory decks stacked over one another. The numbers of the pairs of conductive layers 116 and dielectric layers 118 in each memory deck can be the same or different.

Memory stack 114 can include a plurality of interleaved conductive layers 116 and dielectric layers 118. Conductive layers 116 and dielectric layers 118 in memory stack 114 can alternate in the vertical direction. In other words, except the ones at the top or bottom of memory stack 114, each conductive layer 116 can be adjoined by two dielectric layers 118 on both sides, and each dielectric layer 118 can be adjoined by two conductive layers 116 on both sides. Conductive layers 116 can include conductive materials including, but not limited to, W, Co, Cu, Al, polysilicon, doped silicon, silicides, or any combination thereof. Each conductive layer 116 can include a gate electrode (gate line) surrounded by an adhesive layer and a gate dielectric layer. The gate electrode of conductive layer 116 can extend laterally as a word line, ending at one or more staircase structures of memory stack 114. Dielectric layers 118 can include dielectric materials including, but not limited to, silicon oxide, silicon nitride, silicon oxynitride, or any combination thereof. It is understood that the staircase structure shown in FIG. 1 is for illustrative purposes only and does not reflect or limit the actual arrangements of the staircase region in 3D memory device 100.

As shown in FIG. 1, second semiconductor structure 104 of 3D memory device 100 can also include a first semiconductor layer 120 above memory stack 114 and a second semiconductor layer 122 above and in contact with first semiconductor layer 120. First semiconductor layer 120 can be an example of the "sidewall SEG" as described above. In some embodiments, the lateral dimension of second semiconductor layer 122 is greater than the lateral dimension of first semiconductor layer 120 in the y-direction and/or x-direction. In some embodiments, each of first and second semiconductor layers 120 and 122 is a doped semiconductor layer, e.g., a silicon layer doped with N-type dopants or P-type dopants. Thus, first and second semiconductor layers 120 and 122 can be collectively viewed as a doped semiconductor layer above memory stack 114. It is understood that the doping concentrations in first and second semiconductor layers 120 and 122 may be the same or different.

In some embodiments, each of first and second semiconductor layers 120 and 122 is an N-type doped semiconductor layer, e.g., a silicon layer doped with N-type dopant(s), such as phosphorus (P), arsenic (Ar), or antimony (Sb), which contribute free electrons and increase the conductivity of the intrinsic semiconductor. In some embodiments, second semiconductor layer 122 includes an N-well. That is, second semiconductor layer 122 can be a region in a substrate that is doped with N-type dopant(s), such as P, As, or Sb. First semiconductor layer 120 includes polysilicon, for example, N-type doped polysilicon, according to some embodiments. As described below in detail, first semiconductor layer 120 can be formed above a silicon substrate by thin film deposition and/or epitaxial growth. In contrast, second semiconductor layer 122 includes single crystalline silicon, for example, N-type doped single crystalline silicon, according to some embodiments. As described below in detail, second semiconductor layer 122 can be formed by implanting N-type dopant(s) into a silicon substrate having single crystalline silicon. In some embodiments, the doped semiconductor layer includes a first N-type doped semiconductor layer 120 including polysilicon and a second N-type doped semiconductor layer 122 including single crystalline silicon.

In some embodiments, first semiconductor layer 120 is an N-type doped semiconductor layer, e.g., a silicon layer doped with N-type dopant(s), such as P, Ar, or Sb, and second semiconductor layer 122 is a P-type doped semiconductor layer, e.g., a silicon layer doped with P-type dopant(s), such as boron (B), gallium (Ga), or aluminum (Al), to an intrinsic semiconductor creates deficiencies of valence electrons, called "holes." In some embodiments, second semiconductor layer 122 includes a P-well. That is, second semiconductor layer 122 can be a region in a substrate that is doped with P-type dopant(s), such as B, Ga, or Al. First semiconductor layer 120 includes polysilicon, for example, N-type doped polysilicon, according to some embodiments. As described below in detail, first semiconductor layer 120 can be formed above a silicon substrate by thin film deposition and/or epitaxial growth. In contrast, second semiconductor layer 122 includes single crystalline silicon, for example, P-type doped single crystalline silicon, according to some embodiments. As described below in detail, second semiconductor layer 122 can be formed by implanting P-type dopant(s) into a silicon substrate having single crystalline silicon. In some embodiments, the doped semiconductor layer includes an N-type doped semiconductor layer 120 including polysilicon and a P-type doped semiconductor layer 122 including single crystalline silicon.

In some embodiments, each channel structure 124 includes a channel hole filled with a semiconductor layer (e.g., as a semiconductor channel 128) and a composite dielectric layer (e.g., as a memory film 126). In some embodiments, semiconductor channel 128 includes silicon, such as amorphous silicon, polysilicon, or single crystalline silicon. In some embodiments, memory film 126 is a composite layer including a tunneling layer, a storage layer (also known as a "charge trap layer"), and a blocking layer. The remaining space of channel structure 124 can be partially or fully filled with a capping layer including dielectric materials, such as silicon oxide, and/or an air gap. Channel structure 124 can have a cylinder shape (e.g., a pillar shape). The capping layer, semiconductor channel 128, the tunneling layer, storage layer, and blocking layer of memory film 126 are arranged radially from the center toward the outer surface of the pillar in this order, according to some embodiments. The tunneling layer can include silicon oxide, silicon oxynitride, or any combination thereof. The storage layer can include silicon nitride, silicon oxynitride, silicon, or any combination thereof. The blocking layer can include silicon oxide, silicon oxynitride, high-k dielectrics, or any combination thereof. In one example, memory film 126 can include a composite layer of silicon oxide/silicon oxynitride/silicon oxide (ONO).

In some embodiments, channel structure 124 further includes a channel plug 129 in the bottom portion (e.g., at the lower end) of channel structure 124. As used herein, the "upper end" of a component (e g, channel structure 124) is the end farther away from substrate 101 in the z-direction, and the "lower end" of the component (e.g., channel structure 124) is the end closer to substrate 101 in the z-direction when substrate 101 is positioned in the lowest plane of 3D memory device 100. Channel plug 129 can include semiconductor materials (e.g., polysilicon). In some embodiments, channel plug 129 functions as the drain of the NAND memory string.

As shown in FIG. 1, each channel structure 124 can extend vertically through interleaved conductive layers 116 and dielectric layers 118 of memory stack 114 and first semiconductor layer 120, such as an N-type doped semiconductor layer (e.g., an N-type doped polysilicon layer). In some embodiments, first semiconductor layer 120 surrounds part of channel structure 124 and is in contact with semiconductor channel 128 including polysilicon. That is, memory film 126 is disconnected at part of channel structure 124 that abuts first semiconductor layer 120, exposing semiconductor channel 128 to be in contact with the surrounding first semiconductor layer 120, according to some embodiments. As a result, first semiconductor layer 120 surrounding and in contact with semiconductor channel 128 can work as a "sidewall semiconductor plug/SEG" of channel structure 124 to replace the "bottom semiconductor plug/SEG."

In some embodiments, each channel structure 124 can extend vertically further into second semiconductor layer 122, such as an N-type doped or P-type doped semiconductor layer (e.g., an N-type doped or P-type doped single crystalline silicon layer). That is, each channel structure 124 extends vertically through memory stack 114 into the doped semiconductor layer (including first and second semiconductor layers 120 and 122), according to some embodiments. As shown in FIG. 1, the top portion (e.g., the upper end) of channel structures 124 is in second semiconductor layer 122, according to some embodiments. In some embodiments, each of first and second semiconductor layers 120 and 122 is an N-type doped semiconductor layer to enable gate-induced-drain-leakage (GIDL)-assisted body biasing for erase operations. The GIDL bias around the source select gate of the NAND memory string can generate hole current into the NAND memory string to raise the body potential for erase operations. In some embodiments, first and second semiconductor layers 120 and 122 are an N-type doped semiconductor layer and a P-type doped semiconductor layer, respectively, to enable P-well bulk erase operations where second semiconductor layer 122 is a P-well that provides holes to the NAND memory string for erasing.

As shown in FIG. 1, second semiconductor structure 104 of 3D memory device 100 can further include insulating structures 130 each extending vertically through interleaved conductive layers 116 and dielectric layers 118 of memory stack 114, first semiconductor layer 120, and second semiconductor layer 122. In some embodiments, insulating structure 130 extends further through the doped semiconductor layer including first and second semiconductor layers 120 and 122. As described below in detail with respect to the fabrication process, insulating structure 130 can act as the stop layer to automatically stop the backside thinning process (e.g., a CMP process) of the substrate (including second semiconductor layer 122) on which memory stack 114 is formed. As a result, the upper end of insulating structure 130 is flush with the top surface of second semiconductor layer 122, which is the remainder of the thinned substrate, according to some embodiments. In some embodiments, the upper end of insulating structure 130 is above the upper ends of each channel structure 124. This arrangement can ensure that the backside thinning process can be stopped by insulating structure 130 prior to reaching the upper ends of each channel structure 124. It is understood that in some examples, the upper end of insulating structure 130 may be flush with the upper ends of one or more channel structures 124. Each insulating structure 130 can also extend laterally (e.g., in the word line direction, the x-direction in FIG. 1) to separate channel structures 124 into a plurality of blocks. That is, memory stack 114 can be divided into a plurality of memory blocks by insulating structures 130, such that the array of channel structures 124 can be separated into each memory block.

Different from the slit structures in some 3D NAND memory devices, which include front side source contacts, insulating structure 130 does not include any contact therein (i.e., not functioning as the source contact) and thus, does not introduce parasitic capacitance and leakage current with conductive layers 116 (including word lines), according to some embodiments. In some embodiments, each insulating structure 130 includes an opening (e.g., a slit) filled with one or more dielectric materials, including, but not limited to, silicon oxide, silicon nitride, silicon oxynitride, or any combination thereof. In one example, each insulating structure 130 may be filled with high dielectric constant (high-k) dielectrics and silicon oxide. For example, insulating structure 130 may include a high-k dielectric material along the sidewall and silicon oxide filling the remaining space of the opening.

In some embodiments, second semiconductor structure 104 of 3D memory device 100 includes a source contact 142 below and in contact with first semiconductor layer 120, e.g., an N-type doped semiconductor layer. That is, source contact 142 can be disposed vertically between bonding interface 106 and first semiconductor layer 120 as shown in FIG. 1. First semiconductor layer 120 thus can be electrically connected to peripheral circuit 108 in first semiconductor structure 102 through at least source contact 142 and bonding layers 112 and 110. In some embodiments, second semiconductor structure 104 of 3D memory device 100 further includes another source contact 146 below and in contact with second semiconductor layer 122, e.g., a P-type or N-type doped semiconductor layer. Second semiconductor layer 122 thus can be electrically connected to peripheral circuit 108 in first semiconductor structure 102 through at least source contact 146 and bonding layers 112 and 110. In some embodiments, peripheral circuit 108 in first semiconductor structure 102 controls the source of the NAND memory string through source contact 142 and first semiconductor layer 120 (e.g., acting as the sidewall SEG) and/or through source contact 146 and second semiconductor layer 122. Source contacts 142 and 146 can include one or more conductive layers, such as a metal layer (e.g., W, Co, Cu, or Al) or a silicide layer surrounded by an adhesive layer (e.g., titanium nitride (TiN)).

It is understood that although source contacts 142 and 146 are shown as front side source contacts in FIG. 1 (e.g., on the same side as memory stack 114 with respect to second semiconductor layer 122), in some examples, 3D memory device 100 may include one or more backside source contacts on the opposite side of memory stack 114 with respect to second semiconductor layer 122 (a thinned substrate). For example, the backside source contact may be above memory stack 114 and in contact with second semiconductor layer 122. The backside source contacts may be electrically connected to peripheral circuit 108 in first semiconductor structure 102 through interconnects above second semiconductor layer 122 and interconnects through second semiconductor layer 122.

As shown in FIG. 1, 3D memory device 100 can further include a BEOL interconnect layer 133 for pad-out, e.g., transferring electrical signals between 3D memory device 100 and external circuits. In some embodiments, interconnect layer 133 includes one or more ILD layers 134 on second semiconductor layer 122. The upper end of insulating structure 130 is flush with the bottom surface of ILD layers 134, according to some embodiments. ILD layers 134 in interconnect layer 133 can include dielectric materials including, but not limited to, silicon oxide, silicon nitride, silicon oxynitride, low-k dielectrics, or any combination thereof. In some embodiments, interconnect layer 133 further includes a passivation layer 138 as the outmost layer for passivation and protection of 3D memory device 100. Passivation layer 138 can include dielectric materials, such as silicon nitride. Interconnect layer 133 of 3D memory device 100 can further include contact pads 140 for wire bonding and/or bonding with an interposer. Contact pads 140 in interconnect layer 133 can include conductive materials including, but not limited to W, Co, Cu, Al, silicides, or any combination thereof. In one example, contact pads 140 includes Al.

In some embodiments, second semiconductor structure 104 of 3D memory device 100 further includes contacts 144 through second semiconductor layer 122. As second semiconductor layer 122 can be a thinned substrate, for example, an N-well or a P-well of a silicon substrate, contacts 144 are through silicon contacts (TSCs), according to some embodiments. In some embodiments, source contact 142 extends through second semiconductor layer 122 and ILD layers 134 to be in contact with contact pad 140. In some embodiments, 3D memory device 100 further includes peripheral contacts 148 extending vertically to second semiconductor layer 122 outside of memory stack 114. Peripheral contact 148 can have a depth greater than the depth of memory stack 114 to extend vertically from bonding layer 112 to second semiconductor layer 122 in a peripheral region that is outside of memory stack 114. In some embodiments, peripheral contact 148 is below and in contact with contact 144, such that peripheral circuit 108 in first semiconductor structure 102 is electrically connected to contact pad 140 for pad-out through at least contact 144 and peripheral contact 148. Contact 144 and peripheral contact 148 each can include one or more conductive layers, such as a metal layer (e.g., W, Co, Cu, or Al) or a silicide layer surrounded by an adhesive layer (e.g., TiN). In some embodiments, contact 144 further includes a spacer (e.g., a dielectric layer) that electrically separates contact 144 from second semiconductor layer 122.

As shown in FIG. 1, 3D memory device 100 also includes a variety of local contacts (also known as "Cl") as part of the interconnect structure, which are in contact with a structure in memory stack 114 directly. In some embodiments, the local contacts include channel local contacts 150 each below and in contact with the lower end of a respective channel structure 124. Each channel local contact 150 can be electrically connected to a bit line contact (not shown) for bit line fan-out. In some embodiments, the local contacts further include word line local contacts 152 each below and in contact with a respective conductive layer 116 (including a word line) at the staircase structure of memory stack 114 for word line fan-out. Local contacts, such as channel local contacts 150 and word line local contacts 152, can be electrically connected to peripheral circuits 108 of first semiconductor structure 102 through at least bonding layers 112 and 110. Local contacts, such as channel local contacts 150 and word line local contacts 152, each can include one or more conductive layers, such as a metal layer (e.g., W, Co, Cu, or Al) or a silicide layer surrounded by an adhesive layer (e.g., TiN).

Figure 2A:
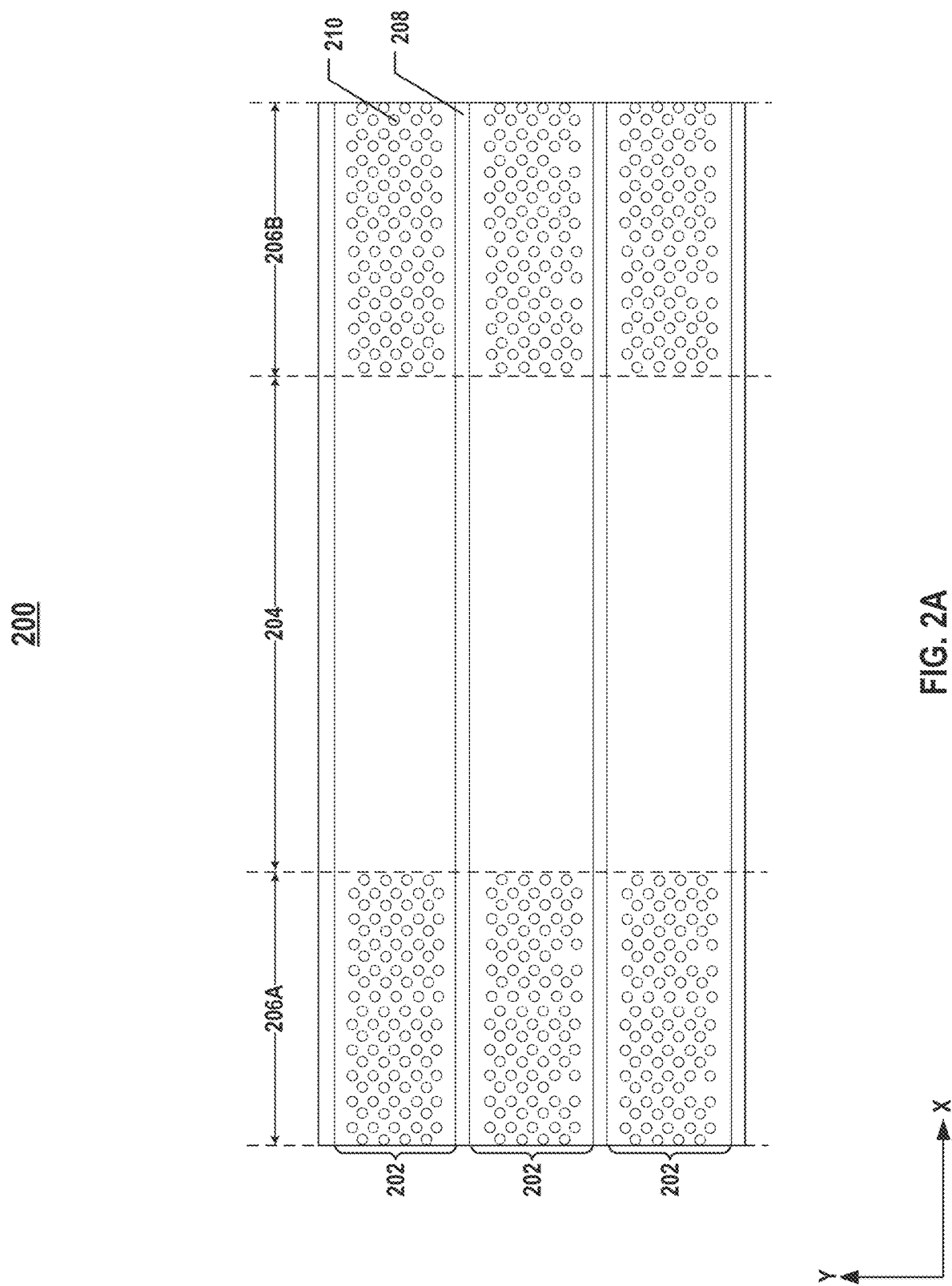
FIG. 2A illustrates a plan view of a cross-section of an exemplary 3D memory device, according to some embodiments of the present disclosure.

FIG. 2A illustrates a plan view of a cross-section of an exemplary 3D memory device 200, according to some embodiments of the present disclosure. 3D memory device 200 may be one example of 3D memory device 100 in FIG. 1. As shown in FIG. 2A, 3D memory device 200 includes a center staircase region 204 laterally separating the memory stack in the x-direction (e.g., the word line direction) into two parts: a first core array region 206A and a second core array region 206B, each of which includes an array of channel structures 210 (corresponding to channel structures 124 in FIG. 1), according to some embodiments. 3D memory device 200 also includes parallel insulating structures 208 (corresponding to insulating structures 130 in FIG. 1) in the y-direction (e.g., the bit line direction) each extending laterally in the x-direction to separate core array regions 206A and 206 and arrays of channel structures 210 therein into blocks 202, according to some embodiments. As shown in FIG. 2A, each insulating structure 208 extends laterally along the x-direction (e.g., the word line direction) over center staircase region 204 and core array regions 206A and 206B, according to some embodiments.

Figure 2B:
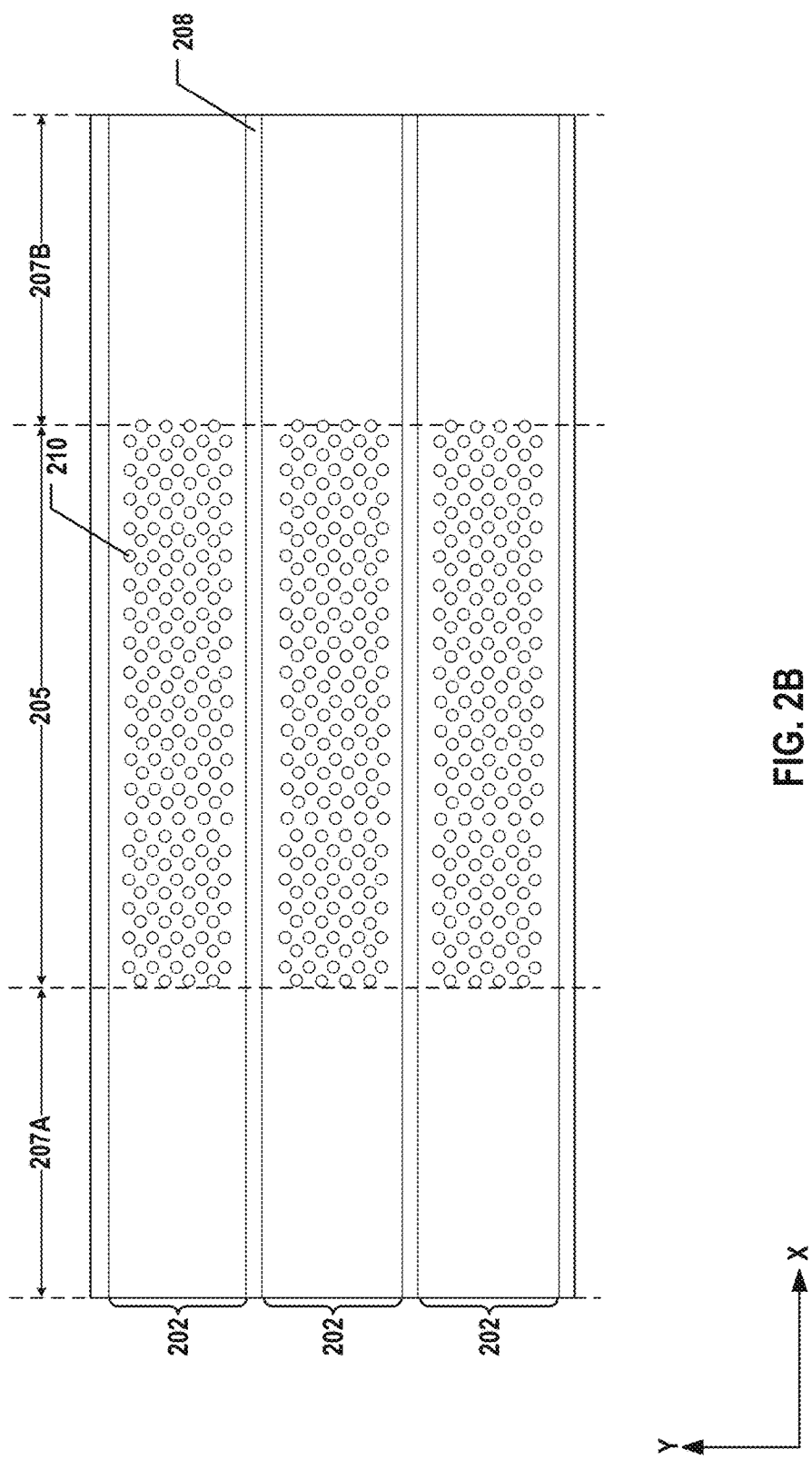
FIG. 2B illustrates a plan view of a cross-section of another exemplary 3D memory device, according to some embodiments of the present disclosure.

It is understood that the layout of the staircase region and core array regions is not limited to the example of FIG. 2A and may include any other suitable layouts, such as having side staircase regions at the edges of the memory stack. For example, FIG. 2B illustrates a plan view of a cross-section of another exemplary 3D memory device 201, according to some embodiments of the present disclosure. 3D memory device 201 may be another example of 3D memory device 100 in FIG. 1. As shown in FIG. 2B, 3D memory device 201 includes side staircase regions 207A and 207B each at the respective edge of the memory stack in the x-direction (e.g., the word line direction) and a center core array region 205 including an array of channel structures 210 (corresponding to channel structures 124 in FIG. 1). 3D memory device 201 also includes parallel insulating structures 208 (corresponding to insulating structures 130 in FIG. 1) in the y-direction (e.g., the bit line direction) each extending laterally in the x-direction to separate center core array region 205 and the array of channel structures 210 therein into blocks 202, according to some embodiments. As shown in FIG. 2B, each insulating structure 208 extends laterally along the x-direction (e.g., the word line direction) over side staircase regions 207A and 207B and center core array region 205, according to some embodiments.

FIGS. 3A-3M illustrate a fabrication process for forming an exemplary 3D memory device, according to some embodiments of the present disclosure. FIGS. 4A and 4B illustrate a flowchart of a method 400 for forming an exemplary 3D memory device, according to some embodiments of the present disclosure. Examples of the 3D memory device depicted in FIGS. 3A-3M, 4A, and 4B include 3D memory device 100 depicted in FIG. 1. FIGS. 3A-3M, 4A, and 4B will be described together. It is understood that the operations shown in method 400 are not exhaustive and that other operations can be performed as well before, after, or between any of the illustrated operations. Further, some of the operations may be performed simultaneously, or in a different order than shown in FIGS. 4A and 4B.

Referring to FIG. 4A, method 400 starts at operation 402, in which a peripheral circuit is formed on a first substrate. The first substrate can be a silicon substrate. As illustrated in FIG. 3K, a plurality of transistors are formed on a silicon substrate 350 using a plurality of processes including, but not limited to, photolithography, etching, thin film deposition, thermal growth, implantation, CMP, and any other suitable processes. In some embodiments, doped regions (not shown) are formed in silicon substrate 350 by ion implantation and/or thermal diffusion, which function, for example, as source regions and/or drain regions of the transistors. In some embodiments, isolation regions (e.g., STIs) are also formed in silicon substrate 350 by wet etching and/or dry etching and thin film deposition. The transistors can form peripheral circuits 352 on silicon substrate 350.

As illustrated in FIG. 3K, a bonding layer 348 is formed above peripheral circuits 352. Bonding layer 348 includes bonding contacts electrically connected to peripheral circuits 352. To form bonding layer 348, an ILD layer is deposited using one or more thin film deposition processes, such as chemical vapor deposition (CVD), physical vapor deposition (PVD), atomic layer deposition (ALD), or any combination thereof, and the bonding contacts are formed through the ILD layer using wet etching and/or dry etching, e.g., RIE, followed by one or more thin film deposition processes, such as ALD, CVD, PVD, any other suitable processes, or any combination thereof.

Method 400 proceeds to operation 404, as illustrated in FIG. 4A, in which a portion of a second substrate is doped, from a first side of the second substrate, to form a doped region. The second substrate can be a silicon substrate. The first side can be the front side at which semiconductor devices are formed on the second substrate. In some embodiments, the first side of the second substrate is doped with N-type dopant(s) to form an N-type doped single crystalline silicon layer, such as an N-well. In some embodiments, the first side of the second substrate is doped with P-type dopant(s) to form a P-type doped single crystalline silicon layer, such as a P-well.

Figure 3A:
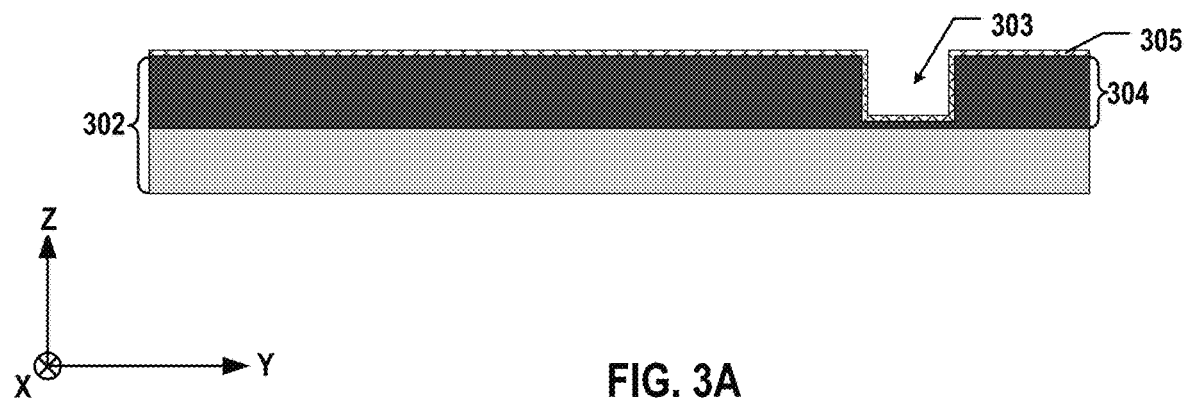
FIGS. 3A-3M illustrate a fabrication process for forming an exemplary 3D memory device, according to some embodiments of the present disclosure.
Figure 4A:
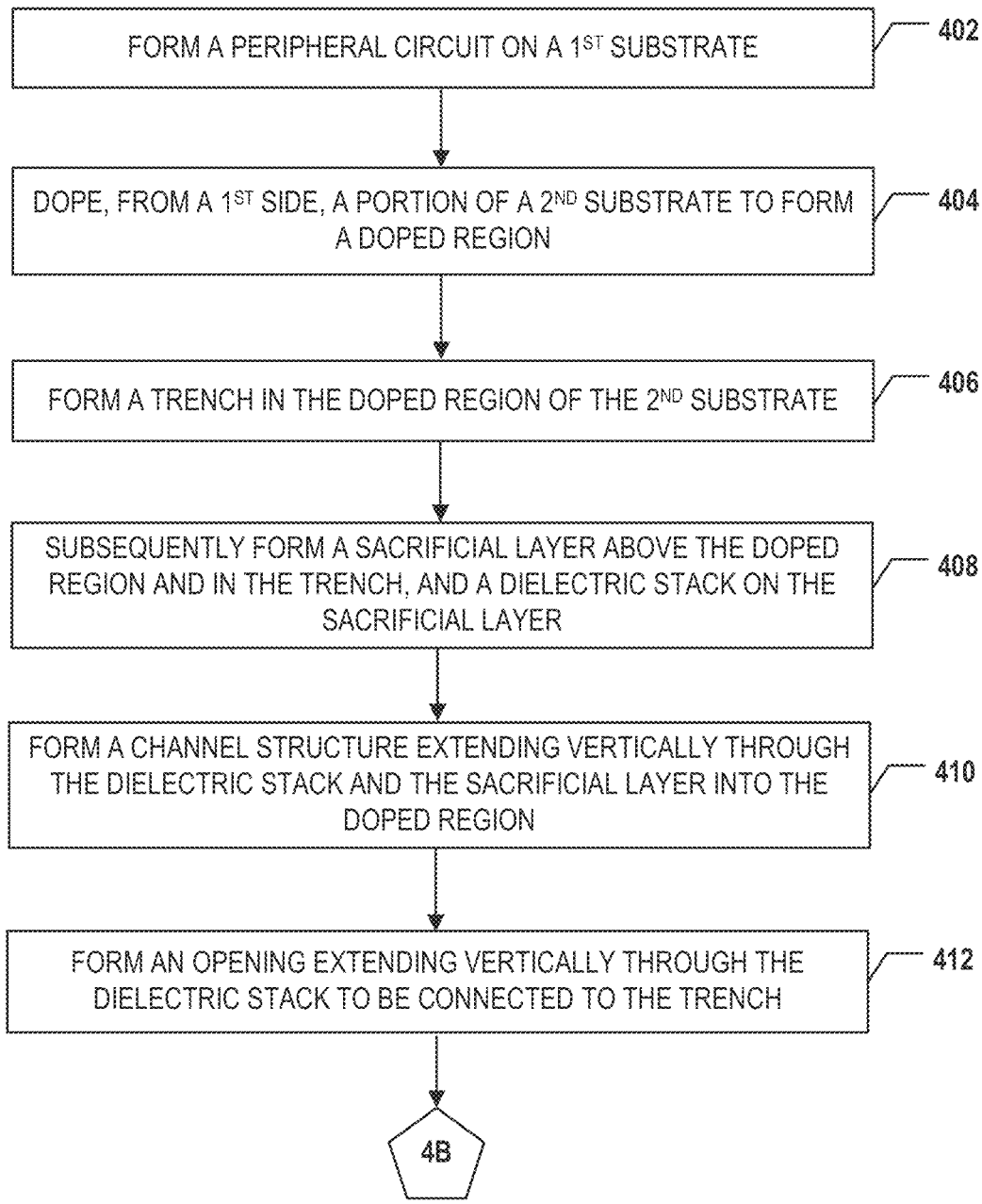
FIGS. 4A and 4B illustrate a flowchart of a method for forming an exemplary 3D memory device, according to some embodiments of the present disclosure.
Figure 4B:
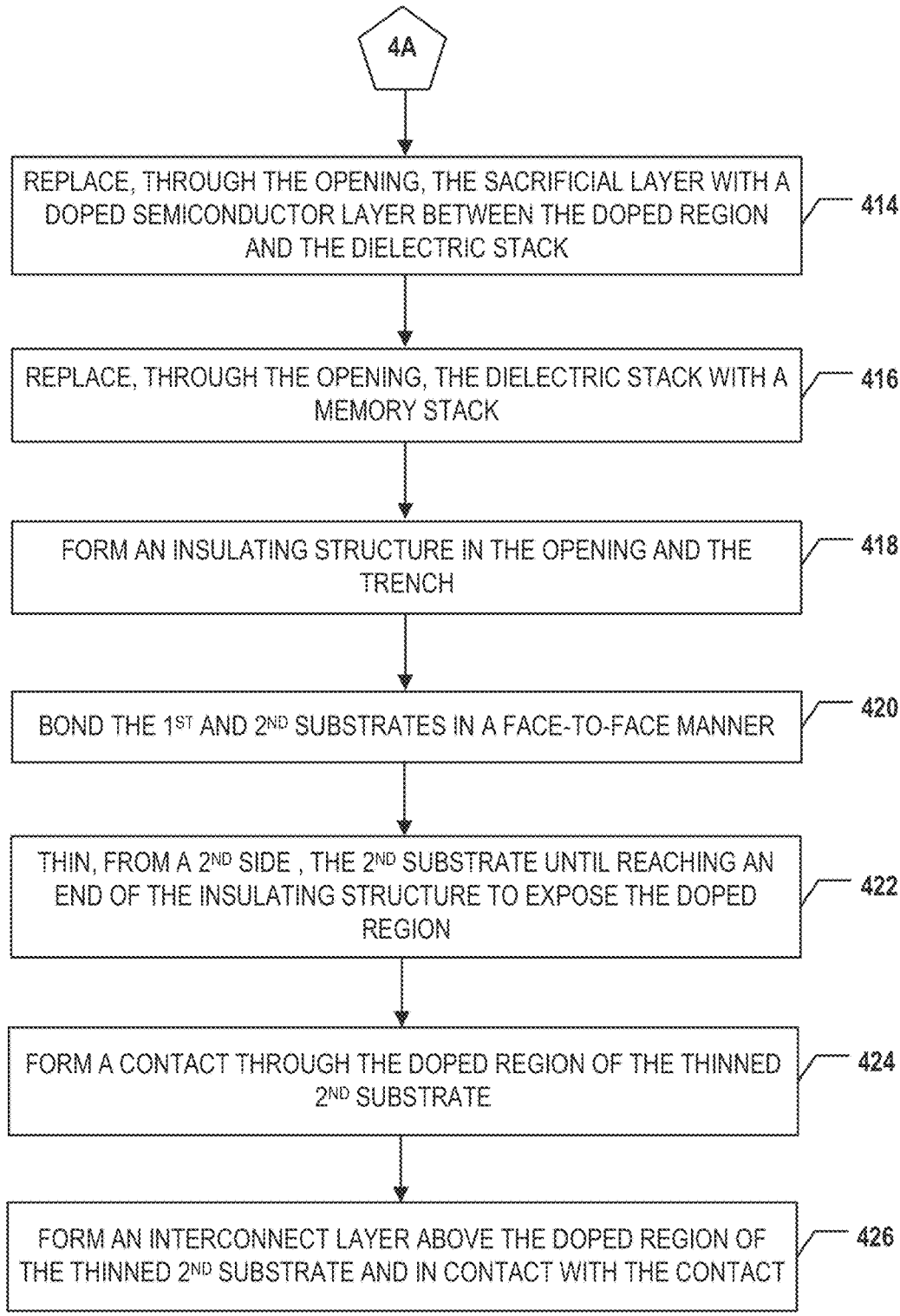

As illustrated in FIG. 3A, part of a silicon substrate 302 is doped to form a doped region 304 of silicon substrate 302, i.e., a doped semiconductor layer. Doped region 304 can include an N-well or a P-well in silicon substrate 302 and include single crystalline silicon. Doped region 304 can be formed by doping N-type dopant(s), such as P, As, or Sb, or P-type dopant(s) such as B, Ga, or Al, into silicon substrate 302 using ion implantation and/or thermal diffusion.

Method 400 proceeds to operation 406, as illustrated in FIG. 4A, in which a trench is formed in the doped region of the second substrate. In some embodiments, the depth of the trench is not greater than the thickness of the doped region of the second substrate. In some embodiments, the trench extends laterally over a staircase region of a dielectric structure.

As illustrated in FIG. 3A, a trench 303 is formed in doped region 304 of a silicon substrate 302 using wet etching and/or dry etching, such as reactive ion etch (RIE). The depth of trench 303 can be nominally the same or less than the thickness of doped region 304 of silicon substrate 302, for example, by controlling the etch rate and/or etch time. That is, the depth of trench 303 is not greater than the thickness of doped region 304, according to some embodiments. In some embodiments, trench 303 extends laterally in the x-direction (e.g., the word line direction) over a staircase region of a dielectric stack 308 (shown in FIG. 3B) to be formed.

Method 400 proceeds to operation 408, as illustrated in FIG. 4A, in which a sacrificial layer above the doped region and in the trench, and a dielectric stack on the sacrificial layer are subsequently formed. The dielectric stack can include interleaved stack sacrificial layers and stack dielectric layers. In some embodiments, to subsequently form the sacrificial layer and the dielectric stack, polysilicon is deposited above the second doped region and in the trench to form the sacrificial layer, and stack dielectric layers and stack sacrificial layers are alternatingly deposited on the sacrificial layer to form the dielectric stack.

Figure 3B:
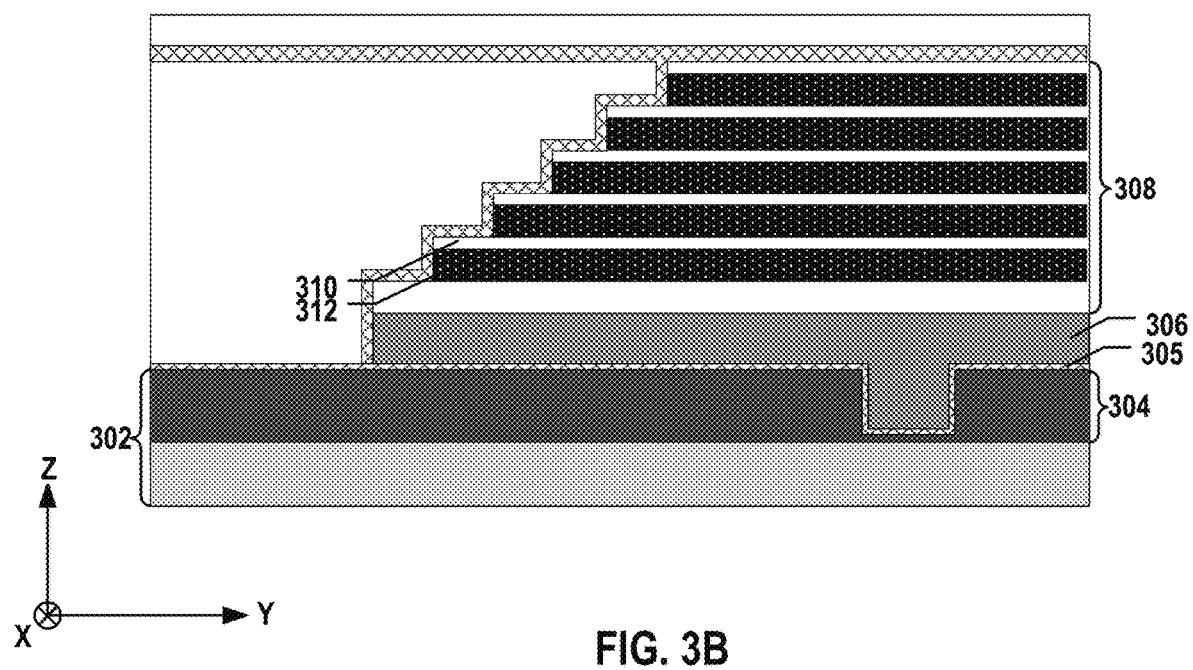

As illustrated in FIG. 3B, a sacrificial layer 306 is formed above doped region 304 of silicon substrate 302. Sacrificial layer 306 also fills trench 303, according to some embodiments. Sacrificial layer 306 can be formed by depositing polysilicon or any other suitable sacrificial material (e.g., carbon) that can be later selectively removed using one or more thin film deposition processes including, but not limited to, CVD, PVD, ALD, or any combination thereof. In some embodiments, a pad oxide layer 305 is formed between sacrificial layer 306 and doped region 304 by depositing dielectric materials, such as silicon oxide, or thermal oxidation, on silicon substrate 302 (e.g., on the top surface of doped region 304 and the sidewall and bottom surface of trench 303) prior to the formation of sacrificial layer 306, as shown in FIG. 3A.

As illustrated in FIG. 3B, a dielectric stack 308 including a plurality pairs of a first dielectric layer (referred to herein as "stack sacrificial layer" 312) and a second dielectric layer (referred to herein as "stack dielectric layers" 310, together referred to herein as "dielectric layer pairs") is formed on sacrificial layer 306. Dielectric stack 308 includes interleaved stack sacrificial layers 312 and stack dielectric layers 310, according to some embodiments. Stack dielectric layers 310 and stack sacrificial layers 312 can be alternatively deposited on sacrificial layer 306 above silicon substrate 302 to form dielectric stack 308. In some embodiments, each stack dielectric layer 310 includes a layer of silicon oxide, and each stack sacrificial layer 312 includes a layer of silicon nitride. Dielectric stack 308 can be formed by one or more thin film deposition processes including, but not limited to, CVD, PVD, ALD, or any combination thereof.

As illustrated in FIG. 3B, a staircase structure can be formed on the edge of dielectric stack 308. The staircase structure can be formed by performing a plurality of so-called "trim-etch" cycles to the dielectric layer pairs of dielectric stack 308 toward silicon substrate 302. Due to the repeated trim-etch cycles applied to the dielectric layer pairs of dielectric stack 308, dielectric stack 308 can have one or more tilted edges and a top dielectric layer pair shorter than the bottom one. It is understood that the staircase structure shown in FIG. 3B is for illustrative purposes only and does not reflect or limit the actual arrangements of the staircase region of dielectric stack 308. FIGS. 2A and 2B above provide examples of possible arrangements of the staircase regions in a memory stack (replacing dielectric stack 308 in later processes). Nevertheless, trench 303 filled with sacrificial layer 306 can extend laterally in the x-direction (e.g., the word line direction) over one or more staircase regions of dielectric stack 308.

Method 400 proceeds to operation 410, as illustrated in FIG. 4A, in which a channel structure extending vertically through the dielectric stack and the sacrificial layer into the doped region of the second substrate is formed. In some embodiments, to form the channel structure, a channel hole extending vertically through the dielectric stack and the sacrificial layer into the doped region is formed, and a memory film and a semiconductor channel are subsequently formed over a sidewall of the channel hole.

Figure 3C:
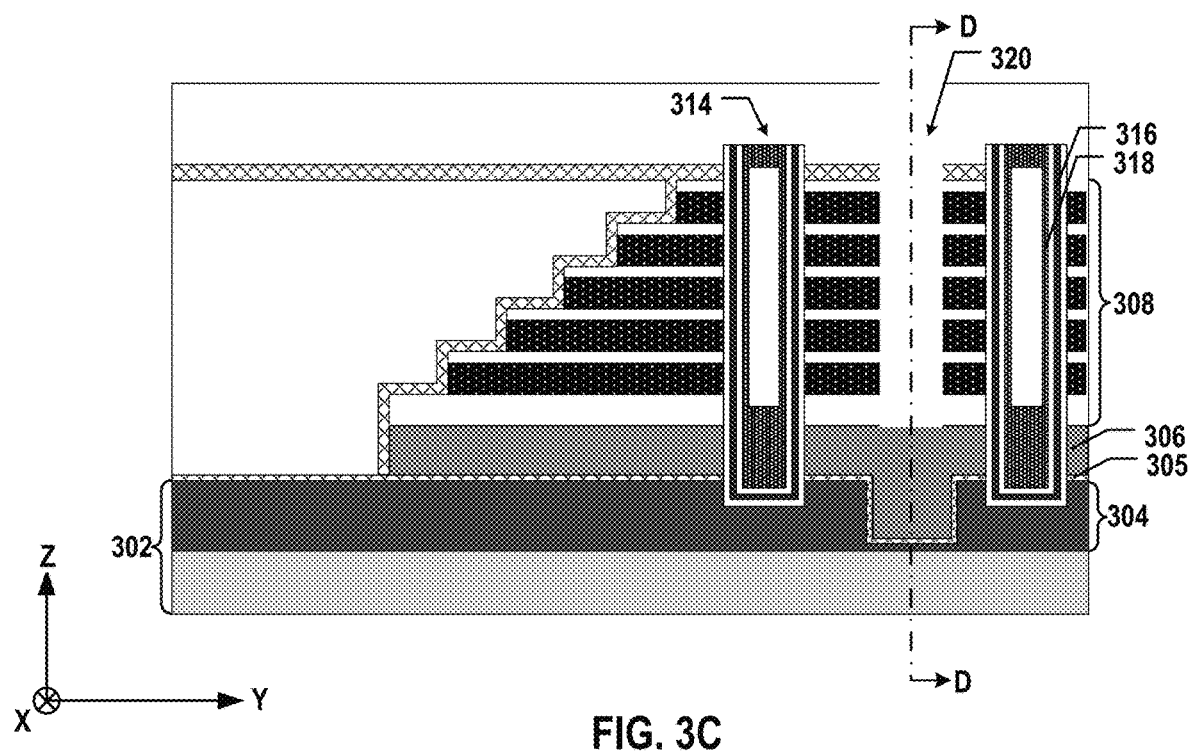
Figure 3D:
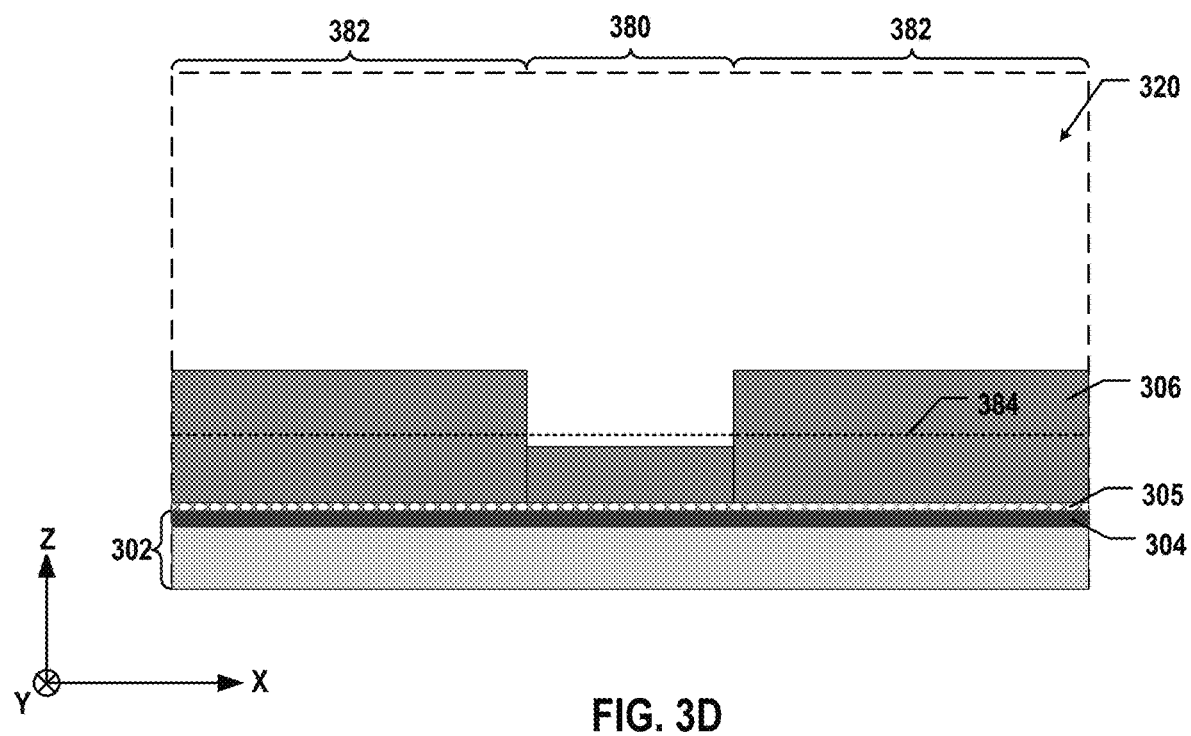

As illustrated in FIG. 3C, a channel hole is an opening extending vertically through dielectric stack 308 and sacrificial layer 306 into doped region 304 of silicon substrate 302. In some embodiments, a plurality of openings are formed, such that each opening becomes the location for growing an individual channel structure 314 in the later process. In some embodiments, fabrication processes for forming the channel hole of channel structure 314 include wet etching and/or dry etching, such as deep RIE (DRIE). In some embodiments, the channel hole of channel structure 314 extends further through the top portion of doped region 304. The etching process through dielectric stack 308 and sacrificial layer 306 may continue to etch part of doped region 304. In some embodiments, a separate etching process is used to etch part of doped region 304 after etching through dielectric stack 308 and sacrificial layer 306. Nevertheless, the channel hole may not extend further beyond the bottom surface of doped region 304. The depth at which trench 303 (shown in FIG. 3A) extends vertically into doped region 304 is greater than the depth at which the channel hole extends vertically into doped region 304, according to some embodiments.

As illustrated in FIG. 3C, a memory film 316 (including a blocking layer, a storage layer, and a tunneling layer) and a semiconductor channel 318 are subsequently formed in this order along sidewalls and the bottom surface of the channel hole. In some embodiments, memory film 316 is first deposited along the sidewalls and bottom surface of the channel hole, and semiconductor channel 318 is then deposited over memory film 316. The blocking layer, storage layer, and tunneling layer can be subsequently deposited in this order using one or more thin film deposition processes, such as ALD, CVD, PVD, any other suitable processes, or any combination thereof, to form memory film 316. Semiconductor channel 318 can then be formed by depositing a semiconductor material, such as polysilicon, over the tunneling layer of memory film 316 using one or more thin film deposition processes, such as ALD, CVD, PVD, any other suitable processes, or any combination thereof. In some embodiments, a first silicon oxide layer, a silicon nitride layer, a second silicon oxide layer, and a polysilicon layer (a "SONO" structure) are subsequently deposited to form memory film 316 and semiconductor channel 318.

As illustrated in FIG. 3C, a capping layer is formed in the channel hole and over semiconductor channel 318 to completely or partially fill the channel hole (e.g., without or with an air gap). The capping layer can be formed by depositing a dielectric material, such as silicon oxide, using one or more thin film deposition processes, such as ALD, CVD, PVD, any other suitable processes, or any combination thereof. A channel plug then can be formed in the top portion of the channel hole. In some embodiments, parts of memory film 316, semiconductor channel 318, and the capping layer that are on the top surface of dielectric stack 308 are removed and planarized by CMP, wet etching, and/or dry etching. A recess then can be formed in the top portion of the channel hole by wet etching and/or drying etching parts of semiconductor channel 318 and the capping layer in the top portion of the channel hole. The channel plug then can be formed by depositing semiconductor materials, such as polysilicon, into the recess by one or more thin film deposition processes, such as CVD, PVD, ALD, or any combination thereof. Channel structure 314 is thereby formed through dielectric stack 308 and sacrificial layer 306 into doped region 304 of silicon substrate 302.

Method 400 proceeds to operation 412, as illustrated in FIG. 4A, in which an opening extending vertically through the dielectric stack is formed to be connected to the trench. In some embodiments, the opening is laterally aligned with the trench, and a lateral dimension of the trench is greater than a lateral dimension of the opening.

As illustrated in FIG. 3C, a slit 320 is an opening that extends vertically through dielectric stack 308 to expose part of sacrificial layer 306. Slit 320 can be laterally aligned with trench 303 (shown in FIG. 3A, filled with sacrificial layer 306) by lithography. In some embodiments, the lateral dimension of trench 303 in the y-direction (e.g., the bit line direction) is greater than the lateral dimension of slit 320 in the y-direction. As a result, slit 320 can be patterned to fall within trench 303 in both the x-direction and y-direction in the plan view. In some embodiments, fabrication processes for forming slit 320 include wet etching and/or dry etching, such as DRIE. In some embodiments, slit 320 extends further into the top portion of sacrificial layer 306. The etching process through dielectric stack 308 may not stop at the top surface of sacrificial layer 306 and may continue to etch part of sacrificial layer 306.

FIG. 3D illustrates the side view of a cross-section of the intermediate structure shown in FIG. 3C along the DD plane through slit 320. Slit 320 and trench 303 each extend laterally along the x-direction (e.g., the word line direction) over staircase region 380 and core array regions 382 of dielectric stack 308, according to some embodiments. It is understood that although FIG. 3D shows an example similar to FIG. 2A having a center staircase region 380 and two core array regions 382, any other suitable arrangements of staircase regions and core array regions, such as the example of FIG. 2B having a center core array region and multiple side staircase regions, may be applicable herein as well. As described above, the film structures of dielectric stack 308 in core array region 382 and staircase region 380 are different as there are fewer stack sacrificial layers 312 (e.g., silicon nitride layers) in staircase region 380 than in core array region 382. As a result, slit 320 may tend to be etched faster and deeper in staircase region 380 than in core array region 382, causing a nonuniform depth distribution of slit 320 along the x-direction as shown in FIG. 3D. By introducing trench 303 and aligning slit 320 with trench 303, the thickness of sacrificial layer 306 becomes greater in the area where slit 320 is to be etched than other areas, functioning as a buffer to avoid over-etching of slit 320 in staircase region 380 that may extend beyond sacrificial layer 306 into silicon substrate 302. FIG. 3D also shows the bottom surface 384 of sacrificial layer 306 in other areas outside of trench 303. Without trench 303, slit 320 in staircase region 380 may extend below the bottom surface 384 of sacrificial layer 306.

As a result, trench 303 laterally aligned with slit 320 and filled with sacrificial layer 306 (e.g., polysilicon) can be used as the etch stop layer in forming slit 320 as well as a buffer to balance the etch loading between core array regions 382 and staircase region 380, thereby compensating for the gouging variation among different regions.

Method 400 proceeds to operation 414, as illustrated in FIG. 4B, in which the sacrificial layer is replaced, through the opening, with a doped semiconductor layer between the doped region and the dielectric stack. In some embodiments, to replace the sacrificial layer with the doped semiconductor layer, the sacrificial layer is etched through the opening to form a cavity between the doped region and the dielectric stack, part of the memory film is etched through the opening to expose part of the semiconductor channel along the sidewall of the channel hole, doped polysilicon is deposited through the opening into the cavity to form the doped semiconductor layer, and part of the doped polysilicon deposited into the opening and the trench is etched through the opening.

Figure 3E:
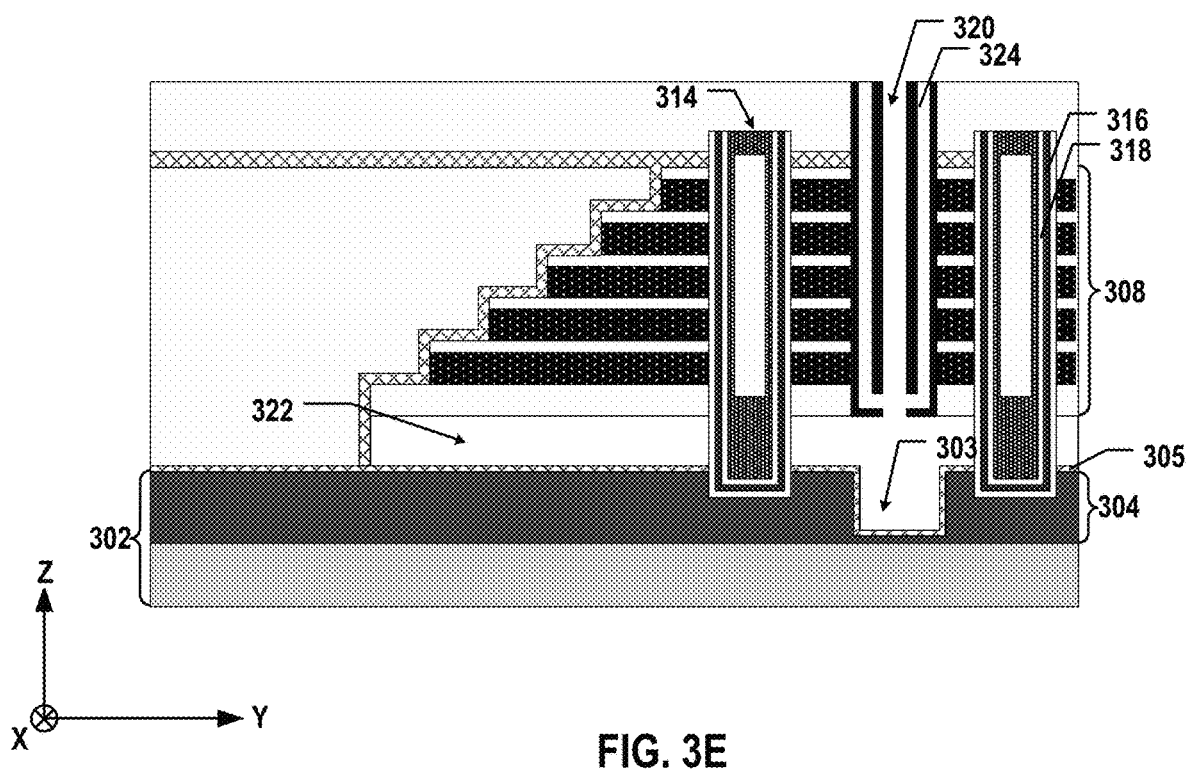

As illustrated in FIG. 3E, sacrificial layer 306 (shown in FIG. 3D) is removed by wet etching and/or dry etching to form a cavity 322 and re-open trench 303. In some embodiments, sacrificial layer 306 includes polysilicon, which can be etched by applying tetramethylammonium hydroxide (TMAH) etchant through slit 320, which can be stopped by pad oxide layer 305 between sacrificial layer 306 and doped region 304. That is, the removal of sacrificial layer 306 does not affect doped region 304, according to some embodiments. In some embodiments, prior to the removal of sacrificial layer 306, a spacer 324 is formed along the sidewall of slit 320. Spacer 324 can be formed by depositing dielectric materials, such as silicon nitride, silicon oxide, and silicon nitride, into slit 320 using one or more thin film deposition processes, such as CVD, PVD, ALD, or any combination thereof.

Figure 3F:
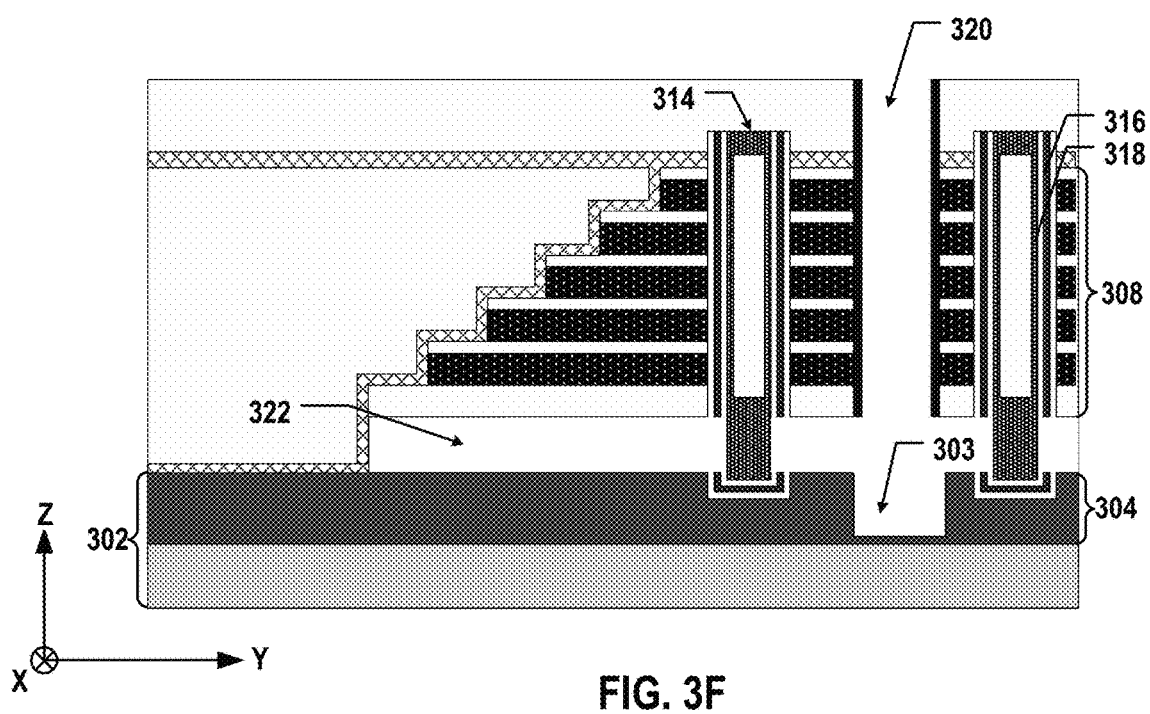

As illustrated in FIG. 3F, part of memory film 316 of channel structure 314 exposed in cavity 322 is removed to expose part of semiconductor channel 318 of channel structure 314 abutting cavity 322. In some embodiments, parts of the blocking layer (e.g., including silicon oxide), storage layer (e.g., including silicon nitride), and tunneling layer (e.g., including silicon oxide) are etched by applying etchants through slit 320 and cavity 322, for example, phosphoric acid for etching silicon nitride and hydrofluoric acid for etching silicon oxide. The etching can be stopped by semiconductor channel 318 of channel structure 314. Spacer 324 including dielectric materials (shown in FIG. 3E) can also protect dielectric stack 308 from the etching of memory film 316 and can be removed by the etchants in the same step as removing part of memory film 316. Similarly, pad oxide layer 305 (shown in FIG. 3E) on doped region 304 (also on the sidewall and bottom surface of trench 303) can be removed as well by the same step as removing part of memory film 316.

Figure 3G:
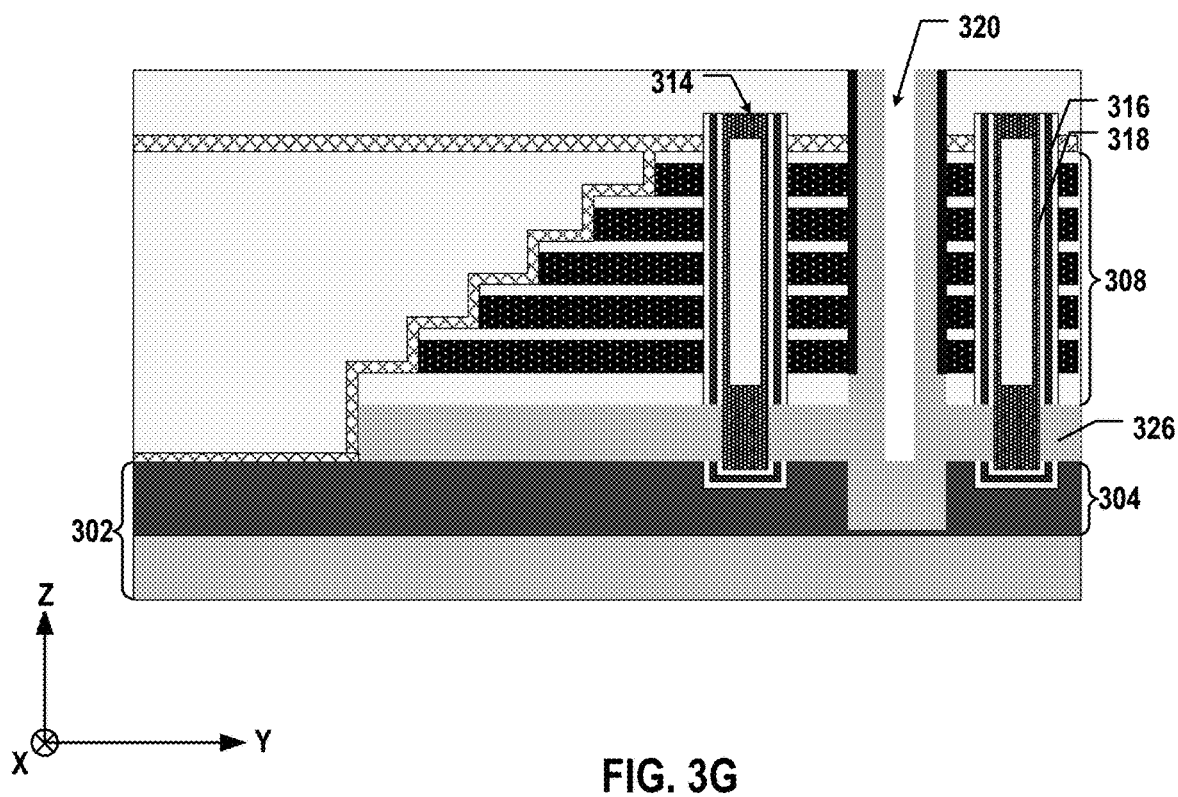

As illustrated in FIG. 3G, a doped semiconductor layer 326 is formed in cavity 322 (shown in FIG. 3F). In some embodiments, doped semiconductor layer 326 is formed by depositing polysilicon into cavity 322 through slit 320 using one or more thin film deposition processes, such as CVD, PVD, ALD, or any combination thereof. In some embodiments, doped semiconductor layer 326 is formed by selectively filling cavity 322 with polysilicon epitaxially grown from the exposed part of semiconductor channel 318 (including polysilicon). The fabrication processes for epitaxially growing doped semiconductor layer 326 can include pre-cleaning cavity 322 followed by, for example, vapor-phase epitaxy (VPE), liquid-phase epitaxy (LPE), molecular-beam epitaxy (MPE), or any combinations thereof. In some embodiments, in-situ doping of N-type dopants, such as P, As, or Sb, is performed when depositing or epitaxially growing polysilicon to form an N-type doped polysilicon layer as doped semiconductor layer 326. Doped semiconductor layer 326 can fill cavity 322 to be in contact with the exposed part of semiconductor channel 318 of channel structure 314.

Figure 3H:
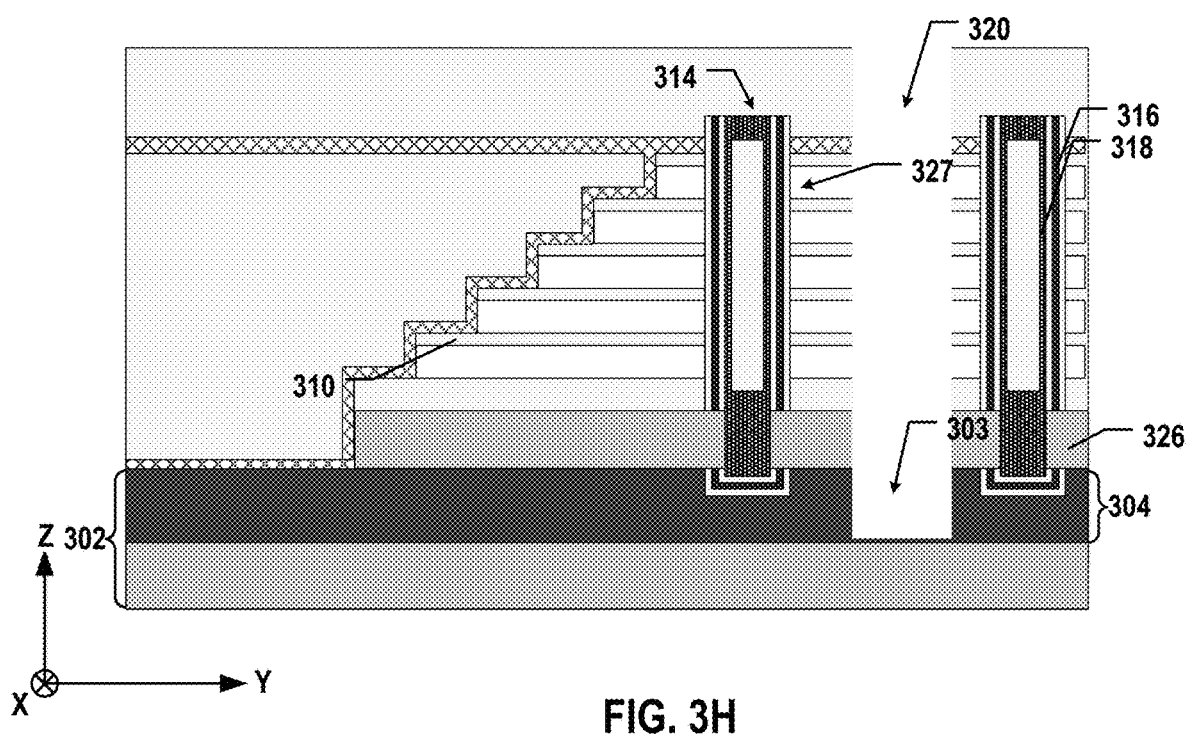

It is understood that doped semiconductor layer 326 may be formed in trench 303 and/or opening 320 as well. As illustrated in FIGS. 3G and 3H, part of doped semiconductor layer 326 deposited into slit 320 and trench 303 is etched through slit 320 using wet etching and/or dry etching, leaving the remainder of doped semiconductor layer 326 between doped region 304 of silicon substrate 302 and dielectric stack 308. The etching of part of doped semiconductor layer 326 in slit 320 and trench 303 can be controlled by controlling the etch rate and/or etch time to avoid etching the remainder of doped semiconductor layer 326 between doped region 304 and dielectric stack 308. Sacrificial layer 306 (shown in FIG. 3C) is thereby replaced, through slit 320, with doped semiconductor layer 326 between doped region 304 and dielectric stack 308, according to some embodiments. Moreover, slit 320 and trench 303 are thereby connected to form a continuous opening extending vertically through dielectric stack 308 and doped semiconductor layer 326 into doped region 304 of silicon substrate 302, according to some embodiments.

Method 400 proceeds to operation 416, as illustrated in FIG. 4B, in which the dielectric stack is replaced with a memory stack, for example, using the so-called "gate replacement" process, such that the channel structure extends vertically through the memory stack and the doped semiconductor layer into the dope region of the second substrate. In some embodiments, to replace the dielectric stack with the memory stack, the stack sacrificial layers are replaced with stack conductive layers through the opening. In some embodiments, the memory stack includes interleaved stack conductive layers and stack dielectric layers.

As illustrated in FIG. 3H, lateral recesses 327 are first formed by removing stack sacrificial layers 312 (shown in FIG. 3A) through slit 320. In some embodiments, stack sacrificial layers 312 are removed by applying etchants through slit 320, creating lateral recesses 327 interleaved between stack dielectric layers 310. The etchants can include any suitable etchants that etch stack sacrificial layers 312 selective to stack dielectric layers 310.

Figure 3I:
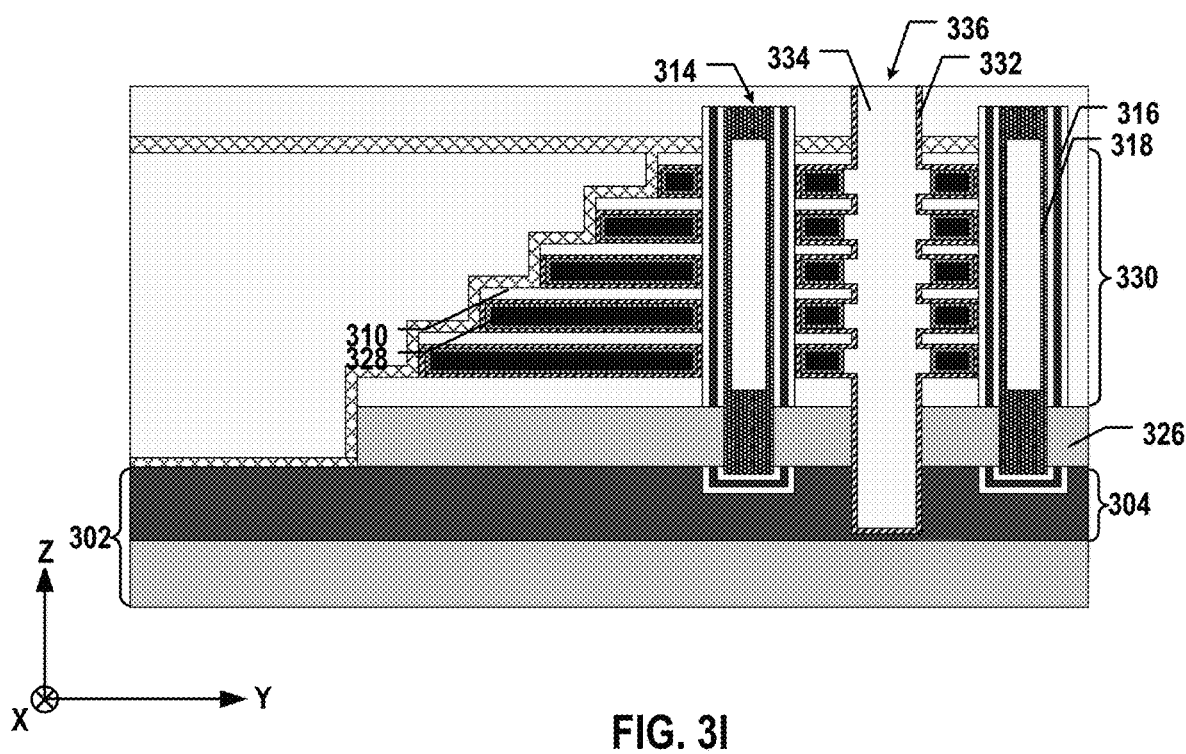

As illustrated in FIG. 3I, stack conductive layers 328 (including gate electrodes and adhesive layers) are deposited into lateral recesses 327 (shown in FIG. 3H) through slit 320. In some embodiments, a gate dielectric layer 332 is deposited into lateral recesses 327 prior to stack conductive layers 328, such that stack conductive layers 328 are deposited on gate dielectric layer 332. Stack conductive layers 328, such as metal layers, can be deposited using one or more thin film deposition processes, such as ALD, CVD, PVD, any other suitable processes, or any combination thereof. In some embodiments, gate dielectric layer 332, such as a high-k dielectric layer, is formed along the sidewall and at the bottom of slit 320 as well. As a result, stack sacrificial layers 312 are thereby replaced with stack conductive layers 328, and a memory stack 330 including interleaved stack conductive layers 328 and stack dielectric layers 310 is thereby formed, replacing dielectric stack 308 (shown in FIG. 3G), according to some embodiments. Channel structure 314 thereby extends vertically through memory stack 330 and doped semiconductor layer 326 into dope region 304 of silicon substrate 302, according to some embodiments.

Method 400 proceeds to operation 418, as illustrated in FIG. 4B, in which an insulating structure is formed in the opening and the trench. The insulating structure can extend vertically through the memory stack and the doped semiconductor layer into the doped region of the second substrate. In some embodiments, to form the insulating structure, one or more dielectric materials are deposited into the opening and the trench to fill the opening and trench. In some embodiments, the depth at which the insulating structure extends vertically into the doped region is greater than the depth at which the channel structure extends vertically into the doped region.

As illustrated in FIG. 3I, an insulating structure 336 extending vertically through memory stack 330 and doped semiconductor layer 326 into doped region 304 is formed. Insulating structure 336 can be formed by depositing one or more dielectric materials, such as silicon oxide, into slit 320 and trench 303 (shown in FIG. 3H) to fully or partially fill slit 320 and trench 303 (with or without an air gap) using one or more thin film deposition processes, such as ALD, CVD, PVD, any other suitable processes, or any combination thereof. In some embodiments, insulating structure 336 includes gate dielectric layer 332 (e.g., including high-k dielectrics) and a dielectric capping layer 334 (e.g., including silicon oxide). In some embodiments, the depth at which insulating structure 336 extends vertically into doped region 304 is greater than the depth at which channel structure 314 extends vertically into doped region 304.

Figure 3J:
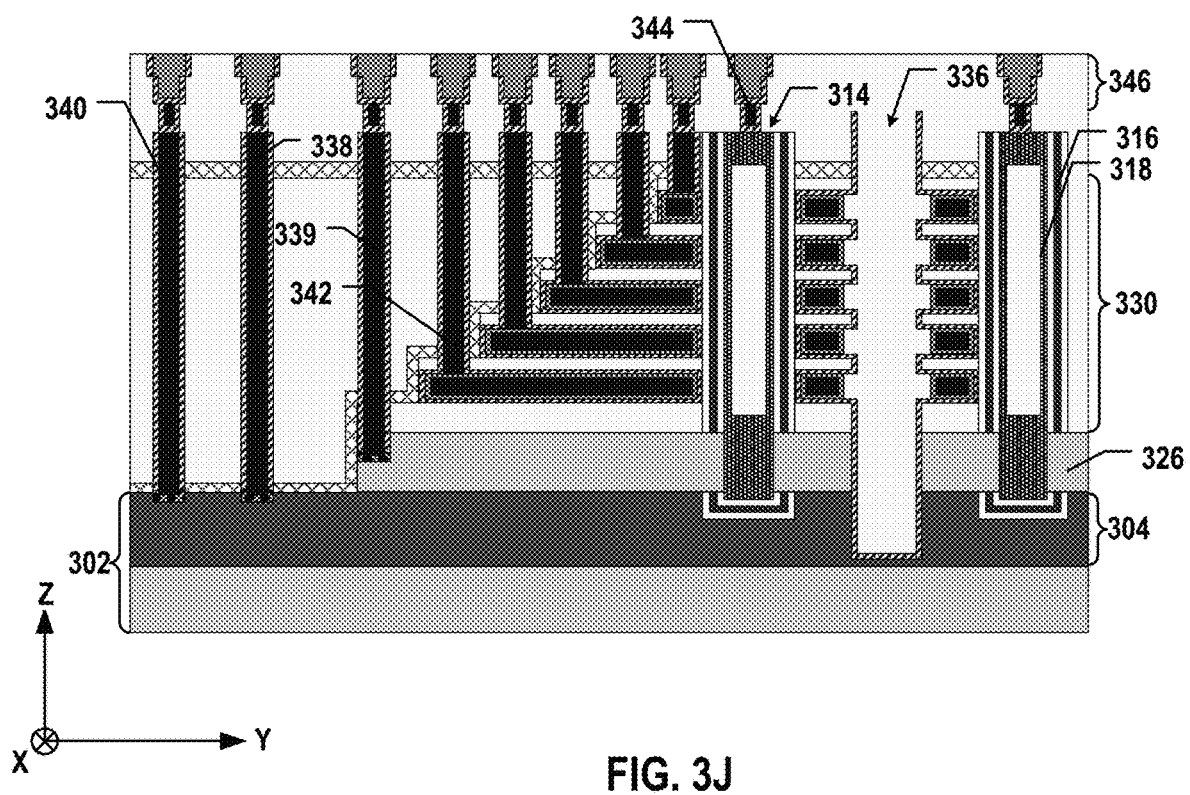
Figure 3K:
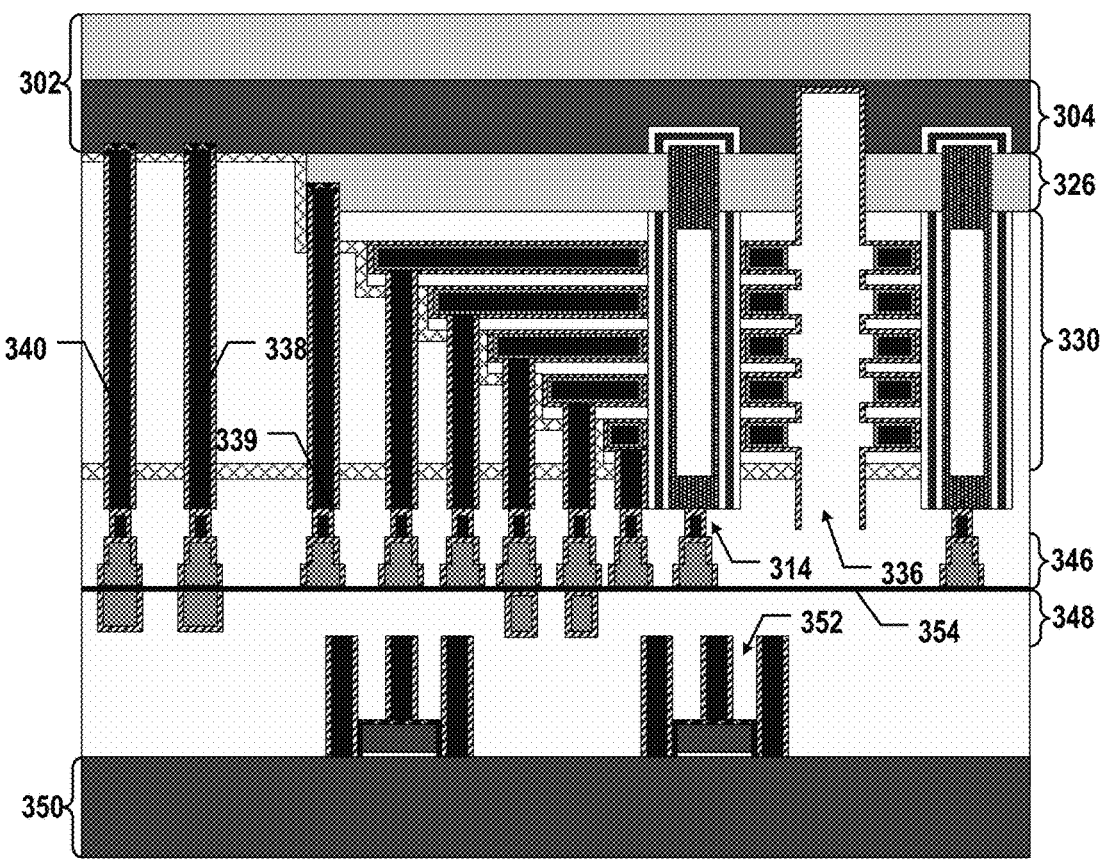

As illustrated in FIG. 3J, after the formation of insulating structure 336, peripheral contacts 340, source contacts 338 and 339, and local contacts, including channel local contacts 344 and word line local contacts 342, are formed. In some embodiments, source contact 339 is formed above and in contact with doped semiconductor layer 326, and source contact 338 is formed above and in contact with doped region 304 of silicon substrate 302. A local dielectric layer can be formed on memory stack 330 by depositing dielectric materials, such as silicon oxide or silicon nitride, using one or more thin film deposition processes, such as CVD, PVD, ALD, or any combination thereof, on top of memory stack 330. Channel local contacts 344, word line local contacts 342, peripheral contacts 340, and source contacts 338 and 339 can be formed by etching contact openings through the local dielectric layer (and any other ILD layers) using wet etching and/or dry etching, e.g., RIE, followed by filling the contact openings with conductive materials using one or more thin film deposition processes, such as ALD, CVD, PVD, any other suitable processes, or any combination thereof.

As illustrated in FIG. 3J, a bonding layer 346 is formed above channel local contacts 344, word line local contacts 342, peripheral contacts 340, and source contacts 338 and 339. Bonding layer 346 includes bonding contacts electrically connected to channel local contacts 344, word line local contacts 342, peripheral contacts 340, and source contacts 338 and 339. To form bonding layer 346, an ILD layer is deposited using one or more thin film deposition processes, such as CVD, PVD, ALD, or any combination thereof, and the bonding contacts are formed through the ILD layer using wet etching and/or dry etching, e.g., RIE, followed by one or more thin film deposition processes, such as ALD, CVD, PVD, any other suitable processes, or any combination thereof.

Method 400 proceeds to operation 420, as illustrated in FIG. 4B, in which the first substrate and the second substrate are bonded in a face-to-face manner, such that the memory stack is above the peripheral circuit. The bonding can be hybrid bonding. As illustrated in FIG. 3K, silicon substrate 302 and components formed thereon (e.g., memory stack 330 and channel structures 314 formed therethrough) are flipped upside down. Bonding layer 346 facing down is bonded with bonding layer 348 facing up, i.e., in a face-to-face manner, thereby forming a bonding interface 354 between silicon substrates 302 and 350, according to some embodiments. In some embodiments, a treatment process, e.g., a plasma treatment, a wet treatment, and/or a thermal treatment, is applied to the bonding surfaces prior to the bonding. After the bonding, the bonding contacts in bonding layer 346 and the bonding contacts in bonding layer 348 are aligned and in contact with one another, such that memory stack 330 and channel structures 314 formed therethrough can be electrically connected to peripheral circuits 352 and are above peripheral circuits 352. In some embodiments, after the bonding, doped semiconductor layer 326 is electrically connected to peripheral circuit 352 through at least source contact 339, and doped region 304 is electrically connected to peripheral circuit 352 through at least source contact 338.

Method 400 proceeds to operation 422, as illustrated in FIG. 4B, in which the second substrate is thinned, from a second side opposite to the first side of the second substrate, the second substrate until reaching an end of the insulating structure to expose the doped region of the second substrate. The thinning is performed from the second side (e.g., the backside) opposite to the first side of the second substrate.

Figure 3L:
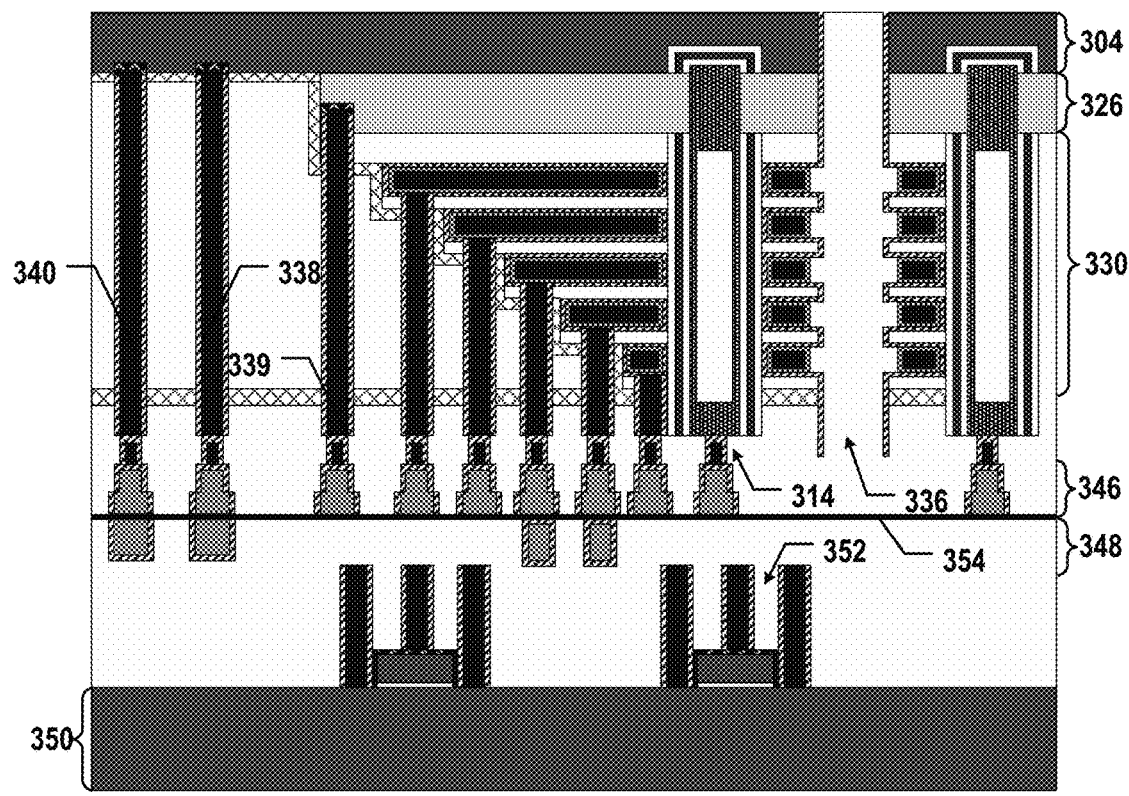
Figure 3L:
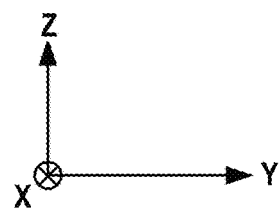

As illustrated in FIG. 3L, silicon substrate 302 (shown in FIG. 3K) is thinned from the backside to expose doped region 304. The backside thinning process can be automatically stopped when reaching the upper end of insulating structure 336 because the materials filling insulating structure 336 (e.g., silicon oxide and high-k dielectrics) are different from the material of silicon substrate 302 (i.e., silicon). Silicon substrate 302 can be thinned using CMP, grinding, dry etching, and/or wet etching. In some embodiments, a CMP process for silicon wafer is applied to thin silicon substrate 302, which is automatically stopped when reaching silicon oxide at the upper end of insulating structure 336. Depending on the depth at which insulating structure 336 extends into doped region 304, the thickness of doped region 304 may be reduced by the thinning process as well, such that the top surface of the remainder of doped region 304 (also referred to herein as another doped semiconductor layer) is flush with the upper end of insulating structure 336, according to some embodiments.

Method 400 proceeds to operation 424, as illustrated in FIG. 4B, in which a contact is formed through the doped region of the thinned second substrate. Method 400 proceeds to operation 426, as illustrated in FIG. 4B, in which an interconnect layer is formed above the doped region of the thinned second substrate and in contact with the contact.

Figure 3M:
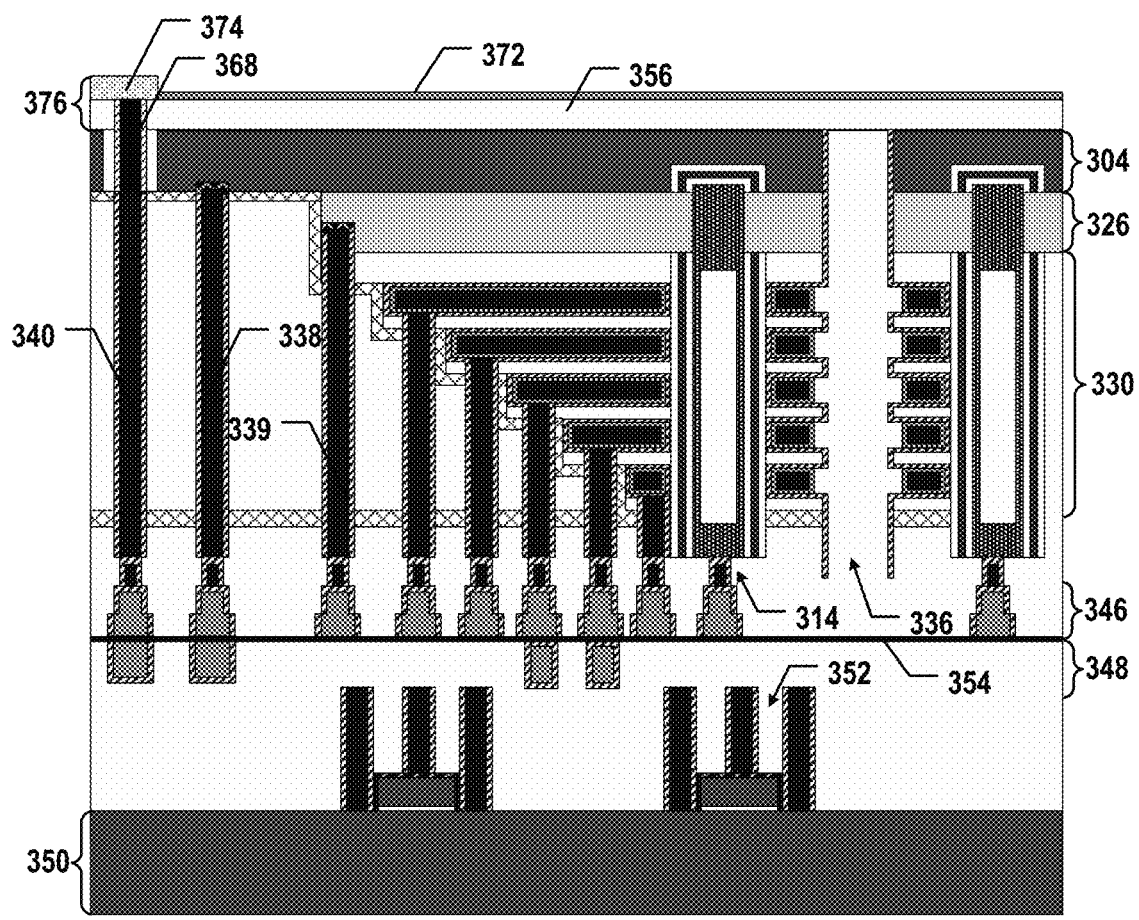

As illustrated in FIG. 3M, one or more ILD layers 356 are formed on doped region 304 (the thinned silicon substrate 302). ILD layers 356 can be formed by depositing dielectric materials on the top surface of doped region 304 using one or more thin film deposition processes, such as ALD, CVD, PVD, any other suitable processes, or any combination thereof. Contacts 368 extend vertically through ILD layers 356 and doped region 304, according to some embodiments. In some embodiments, a contact opening of contact 368 is aligned with peripheral contact 340 and is etched through ILD layers 356 and doped region 304, followed by depositing one or more conductive materials into the contact opening using one or more thin film deposition processes, such as ALD, CVD, PVD, any other suitable processes, or any combination thereof, to fill the contact opening with an adhesive layer (e.g., TiN) and a conductor layer (e.g., W). A planarization process, such as CMP, can then be performed to remove the excess conductive materials, such that the top surface of contact 368 is flush with the top surface of ILD layers 356. In some embodiments, as the contact opening is aligned with peripheral contact 340, contact 368 is above and in contact with peripheral contact 340 as well.

As illustrated in FIG. 3M, a passivation layer 372 can be formed above ILD layer 356. In some embodiments, passivation layer 372 is formed by depositing a dielectric material, such as silicon nitride, using one or more thin film deposition processes, such as ALD, CVD, PVD, any other suitable processes, or any combination thereof. A contact pad 374 is formed above and in contact with contact 368. In some embodiments, part of passivation layer 372 covering contact 368 is removed by wet etching and dry etching to form contact pad 374. As a result, contact pad 374 for pad-out can be electrically connected to peripheral circuits 352 through contact 368, peripheral contact 340, and bonding layers 346 and 348. An interconnect layer 376 including ILD layers 356, contact pads 374, and passivation layer 372 is thereby formed, according to some embodiments.

According to one aspect of the present disclosure, a 3D memory device includes a substrate, a peripheral circuit on the substrate, a memory stack including interleaved conductive layers and dielectric layers above the peripheral circuit, a first semiconductor layer above the memory stack, a second semiconductor layer above and in contact with the first semiconductor layer, a plurality of channel structures each extending vertically through the memory stack and the first semiconductor layer, and an insulating structure extending vertically through the memory stack, the first semiconductor layer, and the second semiconductor layer.

In some embodiments, an upper end of the insulating structure is flush with a top surface of the second semiconductor layer.

In some embodiments, the upper end of the insulating structure is above upper ends of each of the plurality of channel structures.

In some embodiments, the insulating structure is filled with one or more dielectric materials.

In some embodiments, the insulating structure extends laterally to separate the plurality of channel structures into a plurality of blocks.

In some embodiments, each of the plurality of channel structures extends vertically into the second semiconductor layer.

In some embodiments, the second semiconductor layer includes single crystalline silicon. In some embodiments, the first semiconductor layer includes polysilicon.

In some embodiments, the first semiconductor layer is an N-typed doped semiconductor layer, and the second semiconductor layer is an N-type doped semiconductor layer. In some embodiments, the first semiconductor layer is an N-typed doped semiconductor layer, and the second semiconductor layer is a P-type doped semiconductor layer.

In some embodiments, the 3D memory device further includes a source contact below and in contact with the first semiconductor layer, such that the first semiconductor layer is electrically connected to the peripheral circuit through at least the source contact.

In some embodiments, the 3D memory device further includes a bonding interface between the peripheral circuit and the memory stack.

In some embodiments, the 3D memory device further includes a contact through the second semiconductor layer, and an interconnect layer above the second semiconductor layer and including a contact pad electrically connected to the peripheral circuit through at least the contact.

According to another aspect of the present disclosure, a 3D memory device includes a first semiconductor structure, a second semiconductor structure, and a bonding interface between the first semiconductor structure and the second semiconductor structure. The first semiconductor structure includes a peripheral circuit. The second semiconductor structure includes a memory stack including interleaved conductive layers and dielectric layers, a doped semiconductor layer, a plurality of channel structures each extending vertically through the memory stack into the doped semiconductor layer and electrically connected to the peripheral circuit, and an insulating structure extending vertically through the memory stack and the doped semiconductor layer and extending laterally to separate the plurality of channel structures into a plurality of blocks.

In some embodiments, the doped semiconductor layer includes a first N-type doped semiconductor layer including polysilicon and a second N-type doped semiconductor layer including single crystalline silicon. In some embodiments, the doped semiconductor layer includes a first N-type doped semiconductor layer including polysilicon and a P-type doped semiconductor layer including single crystalline silicon.

In some embodiments, each of the plurality of channel structures extends vertically through the first N-type doped semiconductor layer.

In some embodiments, an upper end of the insulating structure is flush with a top surface of the doped semiconductor layer.

In some embodiments, the insulating structure is filled with one or more dielectric materials.

In some embodiments, the second semiconductor structure further includes a source contact vertically between the bonding interface and the doped semiconductor layer, the source contact being in contact with the doped semiconductor layer, such that the doped semiconductor layer is electrically connected to the peripheral circuit through at least the source contact.

According to still another aspect of the present disclosure, a method for forming a 3D memory device is disclosed. A trench is formed in a doped region on a first side of a substrate. A sacrificial layer above the doped region and in the trench, and a dielectric stack on the sacrificial layer are subsequently formed. A channel structure extending vertically through the dielectric stack and the sacrificial layer into the doped region is formed. An opening extending vertically through the dielectric stack is formed to be connected to the trench. The sacrificial layer is replaced, through the opening, with a doped semiconductor layer between the doped region and the dielectric stack. An insulating structure is formed in the opening and the trench. The substrate is thinned from a second side opposite to the first side of the substrate until reaching an end of the insulating structure to expose the doped region.

In some embodiments, the opening is laterally aligned with the trench, and a lateral dimension of the trench is greater than a lateral dimension of the opening.

In some embodiments, a depth of the trench is not greater than a thickness of the doped region of the substrate.

In some embodiments, the trench extends laterally over a staircase region of the dielectric structure.

In some embodiments, after replacing the sacrificial layer with the doped semiconductor layer, the dielectric stack is replaced, through the opening, with a memory stack, such that the channel structure extends vertically through the memory stack and the doped semiconductor layer into the doped region of the substrate.

In some embodiments, to form the channel structure, a channel hole extending vertically through the dielectric stack and the sacrificial layer into the doped region of the substrate is formed, and a memory film and a semiconductor channel along a sidewall of the channel hole are subsequently formed.

In some embodiments, to replace the sacrificial layer with the doped semiconductor layer, the sacrificial layer is etched through the opening to form a cavity between the doped region and the dielectric stack, part of the memory film is etched through the opening to expose part of the semiconductor channel along the sidewall of the channel hole, doped polysilicon is deposited through the opening into the cavity to form the doped semiconductor layer, and part of the doped polysilicon deposited into the opening and the trench is etched through the opening.

In some embodiments, to form the insulating structure, one or more dielectric materials are deposited into the opening and the trench to fill the opening and trench.

According to yet another aspect of the present disclosure, a method for forming a 3D memory device is disclosed. A peripheral circuit is formed on a first substrate. A channel structure and an insulating structure each extending vertically through a memory stack and a doped semiconductor layer into a doped region on a first side of a second substrate are formed. The first substrate and the second substrate are bonded in a face-to-face manner, such that the memory stack is above the peripheral circuit. The second substrate is thinned from a second side opposite to the first side of the second substrate until reaching an end of the insulating structure to expose the doped region of the second substrate.

In some embodiments, a depth at which the insulating structure extends vertically into the doped region is greater than a depth at which the channel structure extends vertically into the doped region.

In some embodiments, after the thinning, a contact through the doped region of the thinned second substrate is formed, and an interconnect layer above the doped region of the thinned second substrate and in contact with the contact is formed.

In some embodiments, prior to the bonding, a source contact above and in contact with the doped semiconductor layer is formed, such that the doped semiconductor layer is electrically connected to the peripheral circuit through at least the source contact after the bonding.

In some embodiments, prior to forming the channel structure and the insulating structure, a portion of the second substrate is doped from the first side to form the doped region, and a trench is formed in the doped region.

In some embodiments, to form the channel structure and the insulating, a sacrificial layer above the doped region and in the trench, and a dielectric stack on the sacrificial layer are subsequently formed, the channel structure extending vertically through the dielectric stack and the sacrificial layer into the doped region is formed, an opening extending vertically through the dielectric stack to be connected to the trench is formed, the sacrificial layer is replaced, through the opening, with the doped semiconductor layer between the doped region and the dielectric stack, and the insulating structure is formed in the opening and the trench.

In some embodiments, the opening is laterally aligned with the trench, and a lateral dimension of the trench is greater than a lateral dimension of the opening.

In some embodiments, a depth of the trench is not greater than a thickness of the doped region of the second substrate.

In some embodiments, the trench extends laterally over a staircase region of the dielectric structure.

In some embodiments, to form the insulating structure, one or more dielectric materials are deposited into the opening and the trench to fill the opening and trench.

In some embodiments, to form the channel structure, a channel hole extending vertically through the dielectric stack and the sacrificial layer into the doped region of the second substrate are formed, and a memory film and a semiconductor channel along a sidewall of the channel hole are subsequently formed.

In some embodiments, to replace the sacrificial layer with the doped semiconductor layer, the sacrificial layer is etched through the opening to form a cavity between the doped region and the dielectric stack, part of the memory film is etched through the opening to expose part of the semiconductor channel along the sidewall of the channel hole, doped polysilicon is deposited through the opening into the cavity to form the doped semiconductor layer, and part of the doped polysilicon deposited into the opening and the trench is etched through the opening.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:
1. A three-dimensional (3D) memory device, comprising:
a peripheral circuit;
a memory stack comprising interleaved conductive layers and dielectric layers above the peripheral circuit;
a first semiconductor layer above the memory stack;

a second semiconductor layer above and in contact with the first semiconductor layer;

a plurality of channel structures each extending vertically through the memory stack and the first semiconductor layer; and an insulating structure extending vertically through the memory stack, the first semiconductor layer, and the second semiconductor layer, wherein the insulating structure extends laterally to separate the plurality of channel structures into a plurality of blocks.

2. The 3D memory device of claim 1, wherein an upper end of the insulating structure is flush with a top surface of the second semiconductor layer.

3. The 3D memory device of claim 2, wherein the upper end of the insulating structure is above upper ends of each of the plurality of channel structures.

4. The 3D memory device of claim 1, wherein the insulating structure is filled with one or more dielectric materials.

5. The 3D memory device of claim 1, wherein each of the plurality of channel structures extends vertically into the second semiconductor layer.

6. The 3D memory device of claim 1, wherein the second semiconductor layer comprises single crystalline silicon.

7. The 3D memory device of claim 1, wherein the first semiconductor layer comprises polysilicon.

8. The 3D memory device of claim 1, wherein the first semiconductor layer is an N-typed doped semiconductor layer, and the second semiconductor layer is an N-type doped semiconductor layer.

9. The 3D memory device of claim 1, wherein the first semiconductor layer is an N-typed doped semiconductor layer, and the second semiconductor layer is a P-type doped semiconductor layer.

10. The 3D memory device of claim 1, further comprising a source contact below and in contact with the first semiconductor layer, such that the first semiconductor layer is electrically connected to the peripheral circuit through at least the source contact.

11. The 3D memory device of claim 1, further comprising a bonding interface between the peripheral circuit and the memory stack.

12. The 3D memory device of claim 1, further comprising:

a contact through the second semiconductor layer; and an interconnect layer above the second semiconductor layer and comprising a contact pad electrically connected to the peripheral circuit through at least the contact.

13. A three-dimensional (3D) memory device, comprising:

a first semiconductor structure comprising a peripheral circuit;

a second semiconductor structure comprising:

a memory stack comprising interleaved conductive layers and dielectric layers;

a doped semiconductor layer;

a plurality of channel structures each extending vertically through the memory stack into the doped semiconductor layer and electrically connected to the peripheral circuit; and an insulating structure extending vertically through the memory stack and the doped semiconductor layer, each array region being separated by the insulating structure in a third direction into a plurality of blocks, the first direction, the second direction, and the third direction are three orthogonal directions, and the insulating structure extending in the first direction and the second direction entirely through the memory stack and the doped semiconductor layer to separate the plurality of channel structures into the plurality of blocks; and a bonding interface between the first semiconductor structure and the second semiconductor structure.

14. The 3D memory device of claim 13, wherein the doped semiconductor layer comprises a first N-type doped semiconductor layer comprising polysilicon and a second N-type doped semiconductor layer comprising single crystalline silicon.

15. The 3D memory device of claim 13, wherein the doped semiconductor layer comprises a first N-type doped semiconductor layer comprising polysilicon and a P-type doped semiconductor layer comprising single crystalline silicon.

16. The 3D memory device of claim 14, wherein each of the plurality of channel structures extends vertically through the first N-type doped semiconductor layer.

17. The 3D memory device of claim 13, wherein an upper end of the insulating structure is flush with a top surface of the doped semiconductor layer.

18. The 3D memory device of claim 13, wherein the insulating structure is filled with one or more dielectric materials.

19. The 3D memory device of claim 13, wherein the second semiconductor structure further comprises a source contact vertically between the bonding interface and the doped semiconductor layer, the source contact being in contact with the doped semiconductor layer, such that the doped semiconductor layer is electrically connected to the peripheral circuit through at least the source contact.

20. The 3D memory device of claim 17, wherein the upper end of the insulating structure is above upper ends of each of the plurality of channel structures.

* * * * *

UNITED STATES PATENT AND TRADEMARK OFFICE
CERTIFICATE OF CORRECTION

PATENT NO. : 11,508,750 B2
APPLICATION NO. : 16/920201
DATED : November 22, 2022
INVENTOR(S) : Kun Zhang et al.

It is certified that error appears in the above-identified patent and that said Letters Patent is hereby corrected as shown below:

In the Claims

Column 24, Line 63, cancel the text beginning with "1. A three-dimensional (3D) memory device" to and ending "blocks." in Column 25, Line 11, and insert the following claim:

-- 1. A three-dimensional (3D) memory device, comprising:
    a peripheral circuit;
    a memory stack comprising interleaved conductive layers and dielectric layers above the peripheral circuit, the memory stack being separated by a staircase region in a first direction into a plurality of array regions;
    a first semiconductor layer above the memory stack;
    a second semiconductor layer above and in contact with the first semiconductor layer;
    a plurality of channel structures each extending vertically in a second direction through the memory stack and the first semiconductor layer; and
    an insulating structure extending vertically through the memory stack, the first semiconductor layer, and the second semiconductor layer, each array region being separated by the insulating structure in a third direction into a plurality of blocks, and the first direction, the second direction, and the third direction being three orthogonal directions,
  wherein the insulating structure extends in the first direction and the second direction entirely through the memory stack, the first semiconductor layer, and the second semiconductor layer to separate the plurality of channel structures into the plurality of blocks. --

Column 25, Line 51, cancel the text beginning with "13. A three-dimensional (3D) memory device" to and ending "semiconductor structure." in Column 26, Line 22, and insert the following claim:
-- 13. A three-dimensional (3D) memory device, comprising:
    a first semiconductor structure comprising a peripheral circuit;
    second semiconductor structure comprising:
        a memory stack comprising interleaved conductive layers and dielectric layers, the memory stack being separated by a staircase region in a first direction into a plurality of array regions;

Signed and Sealed this
Third Day of September, 2024

*Katherine Kelly Vidal*
*Director of the United States Patent and Trademark Office*

CERTIFICATE OF CORRECTION (continued)
U.S. Pat. No. 11,508,750 B2

Page 2 of 2 a doped semiconductor layer;

a plurality of channel structures each extending vertically in a second direction through the memory stack into the doped semiconductor layer and electrically connected to the peripheral circuit; and an insulating structure extending vertically through the memory stack and the doped semiconductor layer, each array region being separated by the insulating structure in a third direction into a plurality of blocks, the first direction, the second direction, and the third direction are three orthogonal directions, and the insulating structure extending in the first direction and the second direction entirely through the memory stack and the doped semiconductor layer to separate the plurality of channel structures into the plurality of blocks; and a bonding interface between the first semiconductor structure and the second semiconductor structure. --